(12) United States Patent
Gupta et al.

(10) Patent No.: US 12,520,452 B2
(45) Date of Patent: Jan. 6, 2026

(54) REPLACEABLE PUMP UNIT FOR COOLING SYSTEMS

(71) Applicant: Hoffman Enclosures Inc., Anoka, MN (US)

(72) Inventors: Abhishek Gupta, Anoka, MN (US); Stefan Djuranec, Anoka, MN (US); Matthew R. Archibald, Derry, NH (US); Dietmar Mann, Anoka, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 283 days.

(21) Appl. No.: 18/312,570

(22) Filed: May 4, 2023

(65) Prior Publication Data

US 2023/0363109 A1 Nov. 9, 2023

Related U.S. Application Data

(60) Provisional application No. 63/338,251, filed on May 4, 2022.

(51) Int. Cl.
*F28F 7/00* (2006.01)
*H05K 7/20* (2006.01)

(52) U.S. Cl.
CPC ..... *H05K 7/20272* (2013.01); *H05K 7/20781* (2013.01)

(58) Field of Classification Search
CPC .............. H05K 7/20272; H05K 7/20781
USPC ....................................................... 165/80.4
See application file for complete search history.

(56) References Cited

U.S. PATENT DOCUMENTS

| | | | |
|---|---|---|---|
| 4,872,319 A | 10/1989 | Tongu | |
| 6,182,742 B1 | 2/2001 | Takahashi et al. | |
| 6,556,437 B1 | 4/2003 | Hardin | |
| 6,666,037 B2 | 12/2003 | Hoshino et al. | |
| 6,714,412 B1 | 3/2004 | Chu et al. | |
| 6,832,489 B2 | 12/2004 | Bash et al. | |
| 6,861,943 B2 | 3/2005 | Pike et al. | |
| 6,973,801 B1 | 12/2005 | Campbell et al. | |
| 7,011,143 B2 | 3/2006 | Corrado et al. | |
| 7,047,753 B2 | 5/2006 | Street et al. | |
| 7,104,081 B2 | 9/2006 | Chu et al. | |
| 7,106,590 B2 | 9/2006 | Chu et al. | |
| 7,135,826 B2 | 11/2006 | Ma et al. | |
| 7,187,550 B1 | 3/2007 | Heydari et al. | |
| 7,219,714 B1 | 5/2007 | Heydari | |

(Continued)

FOREIGN PATENT DOCUMENTS

| | | |
|---|---|---|
| CN | 20990747 Y | 12/2007 |
| CN | 201568349 U | 9/2010 |

(Continued)

*Primary Examiner* — Davis D Hwu
(74) *Attorney, Agent, or Firm* — Quarles & Brady LLP

(57) ABSTRACT

Systems and methods are provided for a high density liquid cooling unit to cool electrical components. A replaceable pump unit (RPU) can include a pump configured to provide fluid flow to cool the electrical components (e.g., via direct liquid cooling of the electrical components by the pumped fluid and air-to-liquid cooling of the pumped fluid via a heat exchanger in fluid communication with the RPU). The RPU can be configured to be operated with or satisfy one or more RPU performance characteristics.

51 Claims, 26 Drawing Sheets

(56) References Cited

U.S. PATENT DOCUMENTS

| | | |
|---|---|---|
| 7,294,980 B2 | 11/2007 | Ma et al. |
| 7,315,448 B1 | 1/2008 | Bash et al. |
| 7,318,322 B2 | 1/2008 | Ota et al. |
| 7,355,852 B2 | 4/2008 | Pfahnl |
| 7,365,973 B2 | 4/2008 | Rasmussen et al. |
| 7,397,661 B2 | 7/2008 | Campbell et al. |
| 7,420,804 B2 | 9/2008 | Leija et al. |
| 7,450,383 B1 | 11/2008 | Li et al. |
| 7,455,103 B2 | 11/2008 | Sato et al. |
| 7,477,516 B2 | 1/2009 | Joshi et al. |
| 7,484,552 B2 | 2/2009 | Pfahnl |
| 7,511,960 B2 | 3/2009 | Hillis et al. |
| 7,559,209 B2 | 7/2009 | Nicolai et al. |
| 7,609,519 B2 | 10/2009 | Campbell et al. |
| 7,630,795 B2 | 12/2009 | Campbell et al. |
| 7,637,312 B1 | 12/2009 | Heydari |
| 7,788,940 B2 | 9/2010 | Madara et al. |
| 7,791,882 B2 | 9/2010 | Chu et al. |
| 7,864,527 B1 | 1/2011 | Whitted |
| 7,872,867 B2 | 1/2011 | Brunschwiler et al. |
| 7,883,023 B1 | 2/2011 | Kainer et al. |
| 7,905,106 B2 | 3/2011 | Attlesey |
| 7,911,793 B2 | 3/2011 | Attlesey |
| 7,950,244 B2 | 5/2011 | Iyengar et al. |
| 8,033,122 B2 | 10/2011 | Bean, Jr. |
| 8,051,897 B2 | 11/2011 | Campbell et al. |
| 8,089,764 B2 | 1/2012 | Attlesey |
| 8,144,467 B2 | 3/2012 | Campbell et al. |
| 8,145,363 B2 | 3/2012 | Bean, Jr. et al. |
| 8,164,466 B2 | 4/2012 | Jang |
| 8,184,436 B2 | 5/2012 | Campbell et al. |
| 8,189,334 B2 | 5/2012 | Campbell et al. |
| 8,254,124 B2 | 8/2012 | Keisling et al. |
| 8,265,307 B2 | 9/2012 | Hama |
| 8,297,067 B2 | 10/2012 | Keisling et al. |
| 8,305,757 B2 | 11/2012 | Keisling et al. |
| 8,322,155 B2 | 12/2012 | Tutunoglu et al. |
| 8,327,656 B2 | 12/2012 | Tutunoglu et al. |
| 8,411,447 B2 | 4/2013 | Turner |
| 8,430,156 B2 | 4/2013 | Malone et al. |
| 8,467,189 B2 | 6/2013 | Attlesey |
| 8,484,436 B2 | 7/2013 | Lunadier et al. |
| 8,583,290 B2 | 11/2013 | Campbell et al. |
| 8,601,827 B2 | 12/2013 | Keisling et al. |
| 8,602,092 B2 | 12/2013 | Lenehan et al. |
| 8,654,529 B2 | 2/2014 | Tufty et al. |
| 8,655,501 B2 | 2/2014 | Vinson et al. |
| 8,672,732 B2 | 3/2014 | Rasmussen et al. |
| 8,690,651 B2 | 4/2014 | Honold et al. |
| 8,757,918 B2 | 6/2014 | Ramnarain et al. |
| 8,789,384 B2 | 7/2014 | Eckberg et al. |
| 8,817,474 B2 | 8/2014 | Campbell et al. |
| 8,820,351 B1 | 9/2014 | Harrington et al. |
| 8,838,286 B2 | 9/2014 | Florez-Larrahondo et al. |
| 8,881,541 B2 | 11/2014 | Noll et al. |
| 8,947,879 B2 | 2/2015 | Broome et al. |
| 8,959,938 B2 | 2/2015 | Ito et al. |
| 9,038,404 B2 | 5/2015 | Judge et al. |
| 9,052,722 B2 | 6/2015 | Chainer et al. |
| 9,086,859 B2 | 7/2015 | Tufty et al. |
| 9,091,496 B2 | 7/2015 | Imwalle et al. |
| 9,095,889 B2 | 8/2015 | Campbell et al. |
| 9,107,327 B2 | 8/2015 | Chainer et al. |
| 9,115,916 B2 | 8/2015 | Tutunoglu et al. |
| 9,122,737 B2 | 9/2015 | Darrington et al. |
| 9,128,681 B2 | 9/2015 | Tufty et al. |
| 9,145,886 B2 | 9/2015 | Ferguson et al. |
| 9,148,983 B2 | 9/2015 | Campbell et al. |
| 9,167,728 B2 | 10/2015 | Schultz |
| 9,176,547 B2 | 11/2015 | Tufty et al. |
| 9,223,360 B2 | 12/2015 | Attlesey |
| 9,267,746 B2 | 2/2016 | Welsch |
| 9,273,906 B2 | 3/2016 | Goth et al. |
| 9,282,684 B2 | 3/2016 | Keisling et al. |
| 9,313,930 B2 | 4/2016 | Goth et al. |
| 9,313,931 B2 | 4/2016 | Goth et al. |
| 9,316,424 B2 | 4/2016 | Lin et al. |
| 9,342,079 B2 | 5/2016 | David et al. |
| 9,357,671 B2 | 5/2016 | Long et al. |
| 9,386,727 B2 | 7/2016 | Barringer et al. |
| 9,392,727 B2 | 7/2016 | Chester et al. |
| 9,445,529 B2 | 9/2016 | Chainer et al. |
| 9,451,726 B2 | 9/2016 | Regimbal et al. |
| 9,451,731 B2 | 9/2016 | Rasmussen et al. |
| 9,476,657 B1 | 10/2016 | Pettis et al. |
| 9,516,794 B2 | 12/2016 | Mulcahy et al. |
| 9,529,395 B2 | 12/2016 | Franz et al. |
| 9,568,206 B2 | 2/2017 | Tutunoglu |
| 9,658,629 B2 | 5/2017 | Haigh |
| 9,668,382 B2 | 5/2017 | Steinke et al. |
| 9,671,128 B2 | 6/2017 | Andrew et al. |
| 9,763,366 B2 | 9/2017 | Keisling et al. |
| 9,769,954 B2 | 9/2017 | Bonnin et al. |
| 9,795,065 B2 | 10/2017 | Shelnutt et al. |
| 9,811,097 B2 | 11/2017 | Arimilli et al. |
| 9,832,913 B2 | 11/2017 | Shedd |
| 9,839,163 B2 | 12/2017 | Keisling et al. |
| 9,839,164 B2 | 12/2017 | Shelnutt et al. |
| 9,845,981 B2 | 12/2017 | Lu et al. |
| 9,848,509 B2 | 12/2017 | Shedd et al. |
| 9,852,963 B2 | 12/2017 | Shedd et al. |
| 9,854,714 B2 | 12/2017 | Shedd |
| 9,854,715 B2 | 12/2017 | Shedd et al. |
| 9,861,013 B2 | 1/2018 | Edwards et al. |
| 9,879,926 B2 | 1/2018 | David et al. |
| 9,901,008 B2 | 2/2018 | Shedd et al. |
| 9,901,013 B2 | 2/2018 | Shedd et al. |
| 9,918,408 B2 | 3/2018 | Regimbal et al. |
| 9,918,409 B2 | 3/2018 | Edwards et al. |
| 9,930,812 B2 | 3/2018 | Vaney et al. |
| 9,943,014 B2 | 4/2018 | Lyon et al. |
| 9,961,800 B2 | 5/2018 | Jin et al. |
| 9,968,010 B2 | 5/2018 | Shelnutt et al. |
| 9,980,413 B2 | 5/2018 | Judge et al. |
| 10,010,013 B2 | 6/2018 | Shelnutt et al. |
| 10,015,912 B2 | 7/2018 | Inano et al. |
| 10,021,805 B2 | 7/2018 | Cox et al. |
| 10,064,314 B2 | 8/2018 | Shelnutt et al. |
| 10,082,845 B2 | 9/2018 | Yatskov |
| 10,088,238 B2 | 10/2018 | Shedd |
| 10,138,901 B2 | 11/2018 | Benson et al. |
| 10,143,111 B2 | 11/2018 | Slaby et al. |
| 10,143,114 B2 | 11/2018 | Shelnutt et al. |
| 10,146,231 B2 | 12/2018 | Shelnutt et al. |
| 10,156,873 B2 | 12/2018 | Shelnutt et al. |
| 10,159,167 B2 | 12/2018 | Altizer et al. |
| 10,162,396 B2 | 12/2018 | Cui et al. |
| 10,172,262 B2 | 1/2019 | Shelnutt et al. |
| 10,184,699 B2 | 1/2019 | Shedd et al. |
| 10,206,312 B2 | 2/2019 | Shelnutt et al. |
| 10,225,958 B1 | 3/2019 | Gao |
| 10,238,009 B2 | 3/2019 | Chainer et al. |
| 10,238,010 B2 | 3/2019 | Shelnutt et al. |
| 10,238,011 B1 | 3/2019 | Cui et al. |
| 10,264,715 B1 | 4/2019 | Ortega |
| 10,299,413 B2 | 5/2019 | Cui et al. |
| 10,303,191 B2 | 5/2019 | Haigh |
| 10,331,144 B2 | 6/2019 | Shelnutt et al. |
| 10,342,163 B2 | 7/2019 | Wong et al. |
| 10,364,809 B2 | 7/2019 | Lyon et al. |
| 10,390,458 B2 | 8/2019 | Tufty et al. |
| 10,412,857 B2 | 9/2019 | Verronen et al. |
| 10,455,726 B2 | 10/2019 | Cader et al. |
| 10,466,724 B2 | 11/2019 | Caron et al. |
| 10,492,341 B2 | 11/2019 | Craft, Jr. et al. |
| 10,609,839 B1 | 3/2020 | Archer et al. |
| 10,617,042 B2 | 4/2020 | Shelnutt et al. |
| 10,619,898 B2 | 4/2020 | Hollander et al. |
| 10,660,239 B2 | 5/2020 | Edwards et al. |
| 10,662,961 B2 | 5/2020 | Campbell et al. |
| 10,711,788 B2 | 7/2020 | Mayleben |
| 10,729,039 B2 | 7/2020 | Shelnutt et al. |
| 10,785,896 B2 | 9/2020 | Wong et al. |
| 10,794,383 B2 | 10/2020 | Edmondson, Jr. et al. |

(56) References Cited

U.S. PATENT DOCUMENTS

| | | |
|---|---|---|
| 10,806,057 B2 | 10/2020 | Wang et al. |
| 10,813,253 B2 | 10/2020 | Lunsman et al. |
| 10,820,450 B2 | 10/2020 | Lyon et al. |
| 10,869,412 B2 | 12/2020 | Chiu et al. |
| 10,905,030 B1 | 1/2021 | Fernandes et al. |
| 10,917,998 B2 | 2/2021 | Shelnutt et al. |
| 10,928,867 B2 | 2/2021 | Slaby et al. |
| 10,939,590 B2 | 3/2021 | Bonnin et al. |
| 10,952,349 B2 | 3/2021 | Zimmerman, Sr. et al. |
| 10,976,788 B2 | 4/2021 | Luxford et al. |
| 11,019,755 B2 | 5/2021 | Campbell et al. |
| 11,039,556 B2 | 6/2021 | Karrat et al. |
| 11,060,757 B2 | 7/2021 | Yang et al. |
| 11,064,635 B2 | 7/2021 | Bonnin et al. |
| 11,083,111 B2 | 8/2021 | Bonnin et al. |
| 11,089,718 B2 | 8/2021 | Vaney et al. |
| 11,096,313 B2 | 8/2021 | Amos et al. |
| 11,098,723 B2 | 8/2021 | Benson et al. |
| 11,122,704 B2 | 9/2021 | Archer et al. |
| 11,149,976 B2 | 10/2021 | Glanzer et al. |
| 11,153,992 B2 | 10/2021 | Cader et al. |
| 11,162,690 B2 | 11/2021 | Rothman et al. |
| 11,178,793 B2 | 11/2021 | Kiernan et al. |
| 11,181,307 B2 | 11/2021 | Nakajima et al. |
| 11,197,397 B2 | 12/2021 | Chiu et al. |
| 11,212,946 B2 | 12/2021 | Shao et al. |
| 11,272,642 B2 | 3/2022 | Gao |
| 11,277,944 B2 | 3/2022 | Chainer et al. |
| 11,310,939 B2 | 4/2022 | Ye et al. |
| 11,345,641 B2 | 5/2022 | Aikyo et al. |
| 11,357,136 B2 | 6/2022 | Deev et al. |
| 11,369,040 B2 | 6/2022 | Amos et al. |
| 11,375,641 B2 | 6/2022 | Lepoudre et al. |
| 11,395,443 B2 | 7/2022 | Varela Benitez et al. |
| 11,445,631 B2 | 9/2022 | Shao et al. |
| 11,470,739 B2 | 10/2022 | Amos et al. |
| 11,536,475 B2 | 12/2022 | Ohta et al. |
| 11,596,082 B2 | 2/2023 | Amos et al. |
| 11,644,215 B2 | 5/2023 | Glanzer et al. |
| 11,653,472 B2 | 5/2023 | Amos et al. |
| 11,716,834 B2 | 8/2023 | Gao |
| 11,729,953 B2 | 8/2023 | Gao |
| 11,737,247 B2 | 8/2023 | Edmunds et al. |
| 11,744,040 B2 | 8/2023 | Shao et al. |
| 11,781,790 B2 | 10/2023 | Luo et al. |
| 12,193,193 B2 | 1/2025 | Varela Benitez et al. |
| 2004/0008483 A1 | 1/2004 | Cheon |
| 2005/0046362 A1 | 3/2005 | Ma et al. |
| 2006/0261761 A1 | 11/2006 | Ma et al. |
| 2007/0213881 A1 | 9/2007 | Belady et al. |
| 2008/0036403 A1 | 2/2008 | Ma et al. |
| 2008/0043433 A1 | 2/2008 | Joshi et al. |
| 2008/0104985 A1 | 5/2008 | Carlsen |
| 2009/0154091 A1 | 6/2009 | Yatskov |
| 2010/0032142 A1 | 2/2010 | Copeland et al. |
| 2011/0075373 A1 | 3/2011 | Campbell et al. |
| 2011/0168379 A1 | 7/2011 | Morgan et al. |
| 2012/0247708 A1 | 10/2012 | Sklenak |
| 2012/0307449 A1 | 12/2012 | Hsu et al. |
| 2013/0027879 A1 | 1/2013 | Saal et al. |
| 2013/0062047 A1 | 3/2013 | Vaney et al. |
| 2013/0112378 A1 | 5/2013 | Shelnutt et al. |
| 2013/0333865 A1 | 12/2013 | Goth |
| 2014/0202678 A1 | 7/2014 | Goth |
| 2014/0373933 A1 | 12/2014 | Harrington et al. |
| 2015/0034271 A1 | 2/2015 | Jin et al. |
| 2015/0114616 A1 | 4/2015 | Lin |
| 2015/0334878 A1 | 11/2015 | Long et al. |
| 2016/0128239 A1 | 5/2016 | Mulcahy et al. |
| 2018/0027698 A1 | 1/2018 | Cader et al. |
| 2018/0067506 A1 | 3/2018 | Hanna et al. |
| 2018/0163730 A1 | 6/2018 | Wilds et al. |
| 2018/0168073 A1 | 6/2018 | Vaney et al. |
| 2018/0217646 A1 | 8/2018 | Mikkelsen et al. |
| 2018/0228055 A1 | 8/2018 | Yoshizumi et al. |
| 2018/0321896 A1 | 11/2018 | Giacaman |
| 2018/0357626 A1 | 12/2018 | Giacaman |
| 2018/0365923 A1 | 12/2018 | Giacaman |
| 2019/0110379 A1 | 4/2019 | Cui et al. |
| 2019/0116694 A1 | 4/2019 | Lyon et al. |
| 2019/0141861 A1 | 5/2019 | Shedd et al. |
| 2019/0343026 A1 | 11/2019 | Zhao et al. |
| 2019/0354121 A1 | 11/2019 | Lyon et al. |
| 2020/0003217 A1 | 1/2020 | Wilds |
| 2020/0107475 A1 | 4/2020 | Keisling et al. |
| 2020/0163257 A1 | 5/2020 | Franz |
| 2020/0182249 A1 | 6/2020 | Mayleben |
| 2020/0205554 A1 | 7/2020 | Deioma |
| 2020/0296861 A1 | 9/2020 | Vaney et al. |
| 2021/0127528 A1 | 4/2021 | Lyon et al. |
| 2021/0243917 A1 | 8/2021 | Gao |
| 2021/0274914 A1 | 9/2021 | Deioma |
| 2021/0295679 A1 | 9/2021 | Rizzi |
| 2021/0298191 A1 | 9/2021 | Shao et al. |
| 2021/0298202 A1 | 9/2021 | Shao et al. |
| 2021/0352830 A1 | 11/2021 | Varela Benitez et al. |
| 2021/0410336 A1 | 12/2021 | Yao et al. |
| 2022/0039889 A1 | 2/2022 | Desai |
| 2022/0071063 A1 | 3/2022 | Heydari |
| 2022/0104402 A1 | 3/2022 | Gao |
| 2022/0117119 A1 | 4/2022 | Heydari |
| 2022/0151112 A1 | 5/2022 | Edmunds et al. |
| 2022/0201896 A1 | 6/2022 | Edmunds et al. |
| 2022/0201902 A1 | 6/2022 | Shaw et al. |
| 2022/0210949 A1 | 6/2022 | Edmunds et al. |
| 2022/0248570 A1 | 8/2022 | Chen et al. |
| 2022/0248571 A1 | 8/2022 | Jia et al. |
| 2022/0330459 A1 | 10/2022 | Chen |
| 2022/0346283 A1 | 10/2022 | Himmelhuber et al. |
| 2022/0354025 A1 | 11/2022 | Varela Benitez et al. |
| 2022/0400579 A1 | 12/2022 | Longhurst et al. |
| 2022/0408609 A1 | 12/2022 | Longhurst et al. |
| 2022/0408615 A1 | 12/2022 | Lyon et al. |
| 2022/0418156 A1 | 12/2022 | Cushen et al. |
| 2023/0029001 A1 | 1/2023 | Edmunds et al. |
| 2023/0059922 A1 | 2/2023 | Lin et al. |
| 2023/0083799 A1 | 3/2023 | Shaw et al. |
| 2025/0142789 A1 | 5/2025 | Varela Benitez et al. |

FOREIGN PATENT DOCUMENTS

| | | |
|---|---|---|
| CN | 202907395 U | 4/2013 |
| CN | 103267362 A | 8/2013 |
| CN | 104254233 B | 1/2017 |
| CN | 104359196 B | 1/2017 |
| CN | 108981074 A | 12/2018 |
| CN | 110007734 A | 7/2019 |
| CN | 110213950 A | 9/2019 |
| CN | 110375405 A | 10/2019 |
| CN | 210247369 U | 4/2020 |
| CN | 112212464 A | 1/2021 |
| CN | 113777916 A | 12/2021 |
| CN | 114390865 A | 4/2022 |
| CN | 114655414 A | 6/2022 |
| CN | 218352965 U | 1/2023 |
| EP | 2827314 B1 | 9/2017 |
| EP | 3757396 A1 | 12/2020 |
| FR | 2474608 A1 * | 7/1981 |
| JP | 2022-049258 A | 3/2022 |
| JP | 2022-049259 A | 3/2022 |
| JP | 2022-049260 A | 3/2022 |
| KR | 0171307 B1 | 3/1999 |
| KR | 10-0573779 B1 | 4/2006 |
| KR | 20-0435992 Y1 | 4/2007 |
| KR | 10-2009-0065732 A | 6/2009 |
| WO | 97/46834 A1 | 12/1997 |
| WO | 2007/084489 A1 | 7/2007 |
| WO | 2011/149023 A1 | 12/2011 |

* cited by examiner

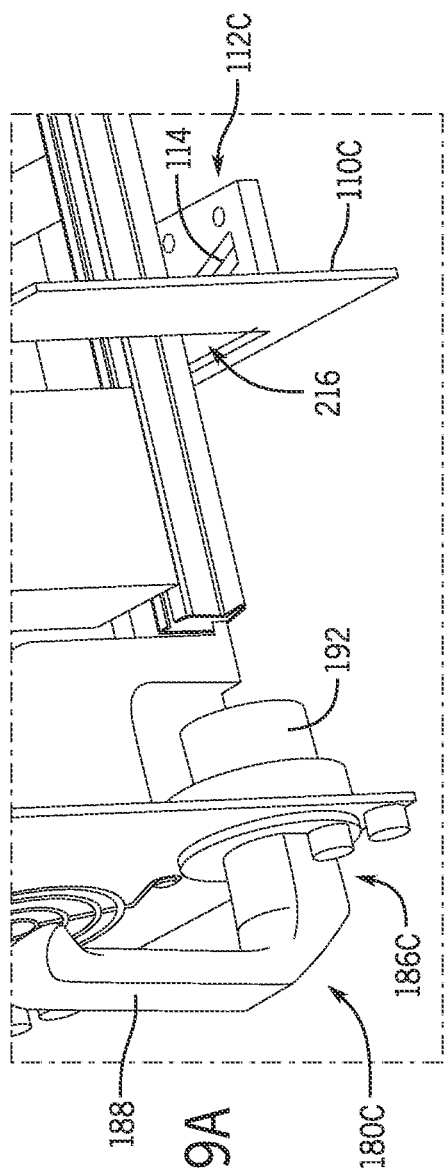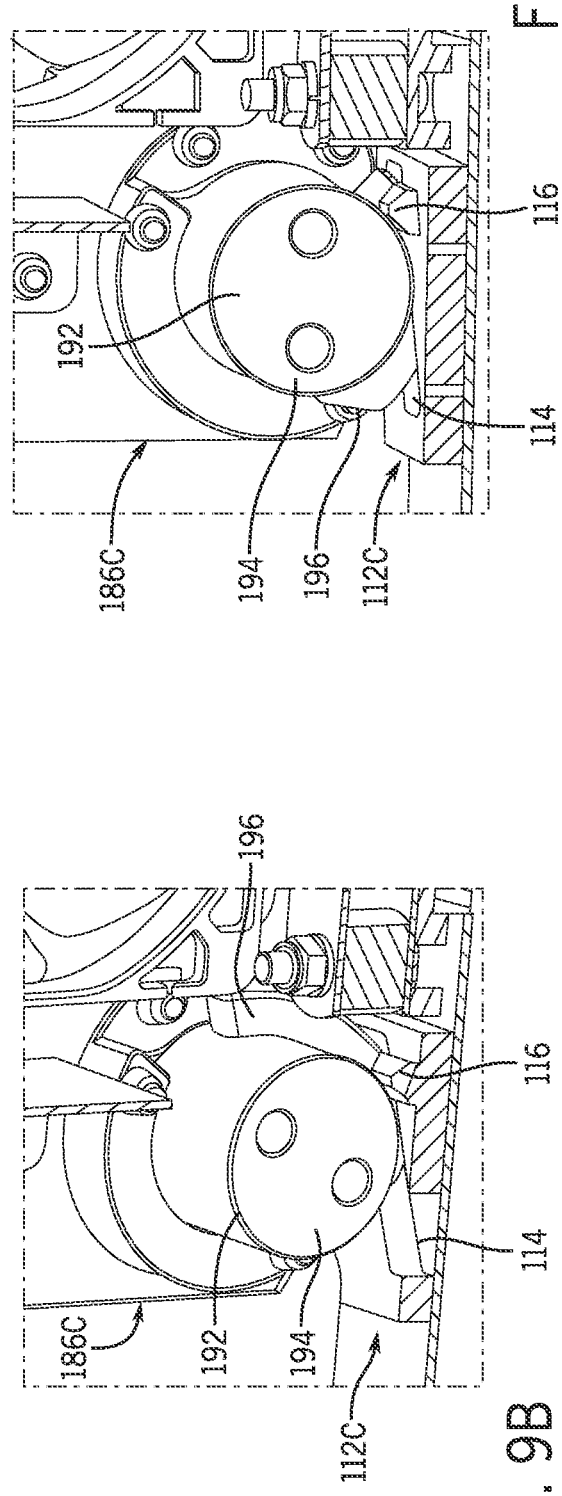

US 12,520,452 B2

REPLACEABLE PUMP UNIT FOR COOLING SYSTEMS

CROSS-REFERENCE TO RELATED APPLICATIONS

This application claims priority to U.S. Provisional Patent Application No. 63/338,251 filed May 4, 2022, the entirety of which is incorporated by reference.

BACKGROUND

Cooling systems can be provided for electrical components in data centers. In some cases, data centers can include liquid cooling circuits, which can provide liquid coolant to electronics housed within the data center. The liquid coolant can be pumped through the liquid cooling circuit by pumps to provide a continuous cooling of electronic components of the data center.

SUMMARY

Embodiments of the invention can provide improved cooling systems, including replaceable pump units (RPUs) that can provide pumped fluid flow for cooling of electrical components. For example, a RPU for liquid cooling of electronic equipment, the RPU can include a first inlet connection module, a first outlet connection module, a base plate including at least one cassette support feature, a locking structure, a first removeable pump cassette, a first removable controller and a second removable controller. The first removable pump cassette can include a cassette frame defining a sled along a bottom of the cassette frame, a rotatable protrusion at a front face of the pump cassette, a locking mechanism being rotatably coupled to the rotatable protrusion, and a pump including a pump inlet connection module and a pump outlet connection module. In a locked configuration, an engagement of the locking structure with the locking mechanism can lock the first removable pump cassette within the RPU, with the first inlet connection module in fluid communication with the pump inlet connection module, and the first outlet connection module in fluid communication with the pump outlet connection module.

BRIEF DESCRIPTION OF THE DRAWINGS

The accompanying drawings, which are incorporated in and form a part of this specification, illustrate examples of the disclosed technology and, together with the description, serve to explain the principles of embodiments of the invention:

FIGS. 7A through 9C illustrate aspects of a locking arrangement and installation/removal process for the pump cassettes of FIGS. 5 and 6;

DETAILED DESCRIPTION

Figure 1A:
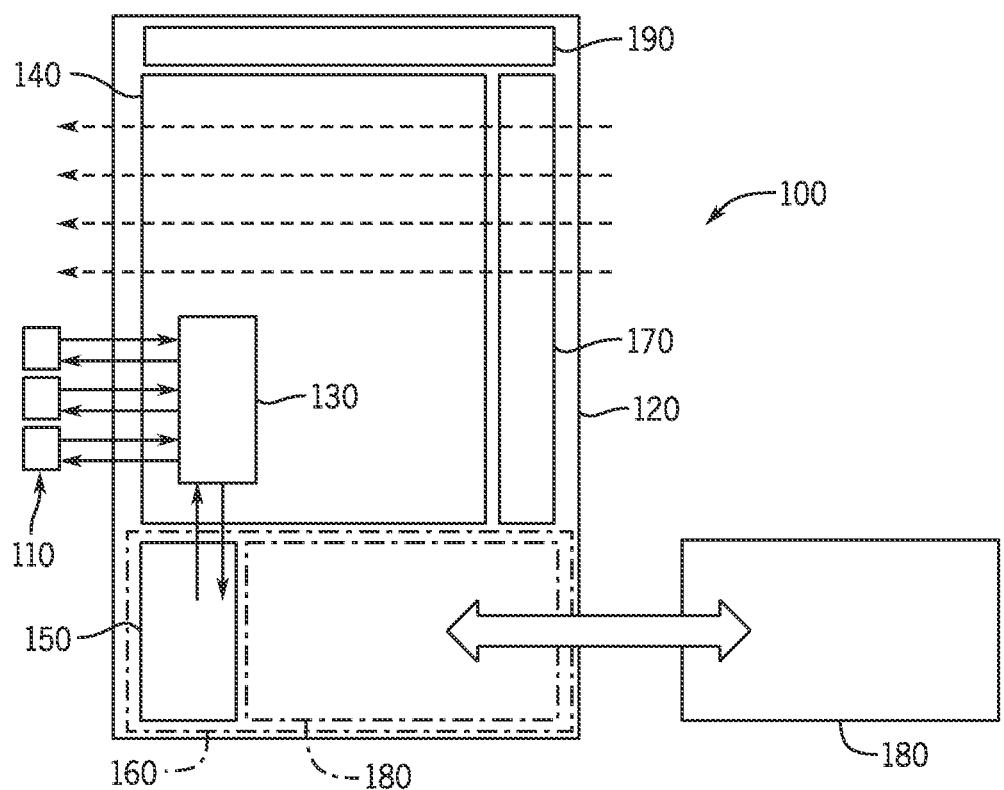
FIG. 1A is a schematic illustration of an example cooling system for electrical components.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Cooling systems can be provided for data centers to cool electrical components within a data center. During operation, electrical components, typically housed in racks having a standard rack footprint (e.g., a standard height, width, and depth), generate heat. As that heat may degrade electrical components, damage the systems, or degrade performance of the components, cooling systems can be provided for data centers for transferring heats away from racks of the data center with electrical components that need to be cooled.

Cabinets or racks containing electrical equipment are typically arranged in rows within a data center, defining aisles between consecutive rows. Racks can be pre-assembled and "rolled in" to a space in the row adjacent to other racks, the space being pre-defined to have the footprint of a standard rack. This arrangement allows a modular construction of or addition to components in a data center. In some configurations, aisles on opposite sides of a rock of cabinets can be alternately designated as a cold aisle, or a hot aisle, and heat generated by the electrical components of a cabinet can be expelled to the hot air aisle.

Some examples of the technology disclosed herein can include cooling distribution units (CDUs), which generally include pump systems and associated components for use in moving fluid along liquid flow paths of cooling systems (e.g., primary or secondary flow loops for liquid cooling of servers or other electronics). In particular, some examples include CDUs configured as replaceable pump units with components for liquid coolant distribution that can be readily installed into and removed from cooling systems, including during ongoing operation of the cooling systems in some embodiments (i.e., with "hot-swappable" components). For example, a replaceable pump unit (RPU) can include an arrangement of components that allow individual pump cassettes to be selectively installed into or removed from a cooling system to provide redundant, hot-swappable pump capacity for a water or other liquid cooling flow. In some cases, an RPU can include structures of a larger cooling system that can receive and secure hot-swappable (or other) cassettes, and ensure leak prevention for liquid connections.

FIG. 1A illustrates a schematic for an example cooling system 100 configured to use air-to-liquid (ATL) heat exchange to transfer heat away from electrical equipment in various numbers of cabinets. Although examples below focus on ATL arrangements, similar systems can generally be used with other cooling arrangements, including for liquid-to-liquid heat exchange, or liquid-to-air heat exchange. In the illustrated embodiment, three distinct racks 110 of electrical equipment are shown schematically on the left, with an in-row cooling device (ICD) 120 on the right. As further discussed below, the racks 110 can be connected to the ICD 120 with a variety of plumbing arrangements (e.g., known tubing, hosing, manifold, or valve arrangements) for flow of cooling fluid (e.g., water, a mixture of water and anti-corrosion agents, a dielectric oil, or propylene glycol) to and from the racks 110. Thus, for example, cooler fluid can flow from the ICD 120 to the racks 110 to remove thermal energy from the electrical equipment therein, and hotter fluid can return from the racks 110 to the ICD 120.

In some examples, the ICD 120 can be housed in a rack having a standard rack footprint for modular assembly, ease of installation and integration within a data center. In other examples, the footprint of an in-row cooling device may be smaller than a standard rack footprint or otherwise sized.

In the illustrated example, a manifold 130 of the ICD 120 is arranged to receive and distribute fluid for flow between the ICD 120 and racks 110, as well as flow between a heat exchanger 140 and a flow connection module 150 of an RPU 160. Accordingly, when at least one pump unit of the RPU 160 operates to provide for cooling flow, the manifold 130 can direct to the heat exchanger 140 fluid that has been heated in the racks 110, and can also direct to the racks 110 fluid that has been cooled by the heat exchanger 140.

A wide variety of manifold configurations are possible. In some examples, the manifold 130 can include a unified assembly to support one or more of: connections (e.g., quick-connection fittings) and conduits for flow to and from the racks 110; connections and conduits for flow to and from the RPU 160; or connections and conduits for flow to and from the heat exchanger 140. In some examples, the manifold 130 can include distributed arrangements, including individual components or component assemblies distributed variously around the RPU 160 for connections and flow between these various sub-systems.

In some examples, the manifold 130 can include the connection module 150 as part of a unified assembly. In some example, including as shown in FIG. 1, the connection module 150 may be separate from a manifold for distribution of fluid to or from the racks 110 and flow components of various known types (e.g., tubing, fittings, valves, filters, etc.) can be arranged to allow flow between the connection module 150 and one or more other sub-systems of the cooling system 100 (e.g., the manifold 130 as shown in FIG. 1, the heat exchanger 140, the racks 110 without an intervening distinct manifold, etc.).

In some embodiments, fans may be provided to generate an airflow across the heat exchanger 140, to increase a cooling efficiency of the system 100. In some embodiments, the fans can further enhance a cooling of the system by directing the air toward a hot aisle, for example. In the illustrated example, a fan bank 170 is included in the ICD 120 to provide forced air flow across the heat exchanger 140 (see dashed arrows). Although the air flow from the fan bank 170 is illustrated as being directed toward the racks 110, those of skill in the art will understand that actual implementations may locate the racks 110 out of the path of the heated air. The fan bank 170 can include any number of fan modules, as appropriate, including hot-swappable fans arranged in vertical or laterally arrayed patterns. Further, while, in the illustrated embodiment, an air flow is shown in a direction from the fan bank 170 toward the heat exchanger 140, in other configurations, fans can draw air across a heat exchanger in a direction from the heat exchanger toward a fan bank (e.g., in a direction opposite the direction illustrated).

In different implementations, the fan bank 170 can be at the side, front, or rear of the ICD 120, can be included on a door of the ICD 120, or can be otherwise located. In some examples, the fan bank 170 can be included in a unified housing with the heat exchanger 140, the manifold 130, or the RPU 160. In some examples, the fan bank 170 can be a removable (e.g., external) module that can be selectively attached to a separate housing for the heat exchanger 140, the manifold 130, or the RPU 160. In some examples, the fan bank 170 and the heat exchanger 140 can be housed in a door mounted to one of the racks 110 (e.g., as a rear door heat exchanger unit).

As noted above, some examples can include hot-swappable pump assemblies, including as can be configured with hot-swappable pump cassettes. Pump cassettes can be self-contained modules that include a pump for an RPU, inlet and outlet connections for the pump (e.g., known types of quick-connect fittings), and a cassette frame that supports the pump for operation within an RPU (and ICD) and also supports the inlet and outlet connections for the pump to be appropriately engaged with corresponding connections for the RPU within the ICD. Correspondingly, in the illustrated example of FIG. 1A, the ICD 120 of the cooling system 100 includes at least one pump cassette 180, which is configured (as shown by block arrow) for hot-swappable installation into or removal from the ICD 120. In the illustrated example, the ICD 120 includes bays for two pump cassettes within the RPU 160 and the ICD 120 can thus receive two substantially identical instances of the pump cassette 180 (e.g., in a side-by-side or stacked configuration) for parallel or redundant operation. In other embodiments, other arrangements (e.g., different numbers) of RPUs, pump cassettes (e.g., pump cassette 180) or of corresponding sub-systems of an ICD (e.g., bays within the ICD for RPUs) are possible.

Figure 1B:
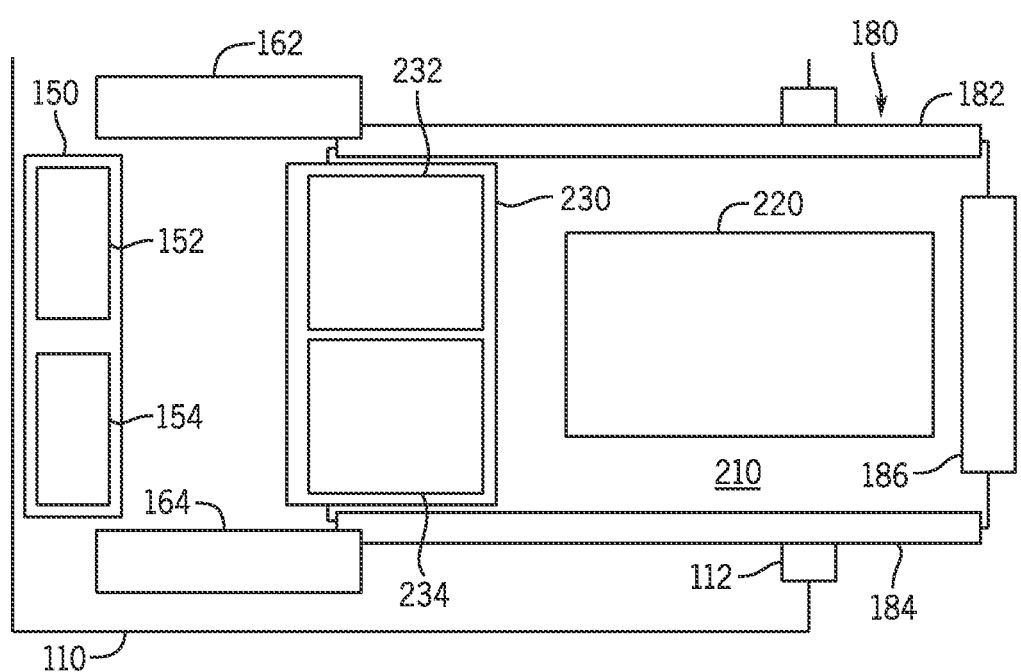
FIG. 1B is a schematic illustration of certain components of the cooling system of FIG. 1A, including a replaceable pump unit (RPU) with a hot-swappable pump cassette.

FIG. 1B illustrates example arrangements of the ICD 120 and the pump cassette 180 of the RPU 160 to provide hot-swappable pump capacity for cooling operations with the cooling system 100. Only one pump cassette 180 is shown in FIG. 1B for clarity of presentation. As noted above, some implementations can include multiple pump cassettes, including multiple substantially identical (or other) cassettes configured for parallel or redundant operation for cooling operations.

In the illustrated example, the pump cassette 180 includes a cassette frame 210 that supports a pump 220 and a flow connection module 230 in fluid communication with the pump 220. The flow connection module 230 includes an inlet connection 232 and an outlet connection 234, which are configured to interface with outlet connection 152 and inlet connection 154, respectively, of the connection module 150 of the RPU 160 within the ICD 120. Thus, when installed with the connection modules 232, 152 and 234, 154 engaged, the pump 220 can provide flow for cooling operations of the ICD 120 (e.g., via the manifold 130 as discussed above) and the cooling system 100 as a whole.

In some cases, other connection types can be included in the modules 150, 230 or otherwise. For example, some connection modules for an RPU can include electronic connection modules as can allow electronic communication and power transfer between the RPU and an ICD generally (e.g., for the pump 220, various sensors (not shown in FIGS. 1A and 1B), fan modules of the fan bank 170, one or more controllers on the pump cassette 180 or within the ICD 120, etc.). In some embodiments electronic connection modules can permit communication between control systems on an RPU (e.g., a variable frequency drive for the pump 220) and a larger control system of the cooling system 100 (e.g., a programmable electronic controller 190 included in the ICD 120 (see FIG. 1A)).

In different examples, the cassette frame 210 can be differently configured. In some examples, the cassette frame 210 can include a skeletal support structure such as, for example, edge struts to form a rectangular scaffolding to which the pump 220 and the flow connection module 230 can be secured. In some examples, the cassette frame 210 can include a sled (e.g., an enclosed or partly enclosed rectangular box structure) that can support and more extensively shield the pump 220 and the flow connection module 230. For example, the cassette frame 210 can be formed primarily as a bent sheet metal structure with a support floor for the pump 220, one or more side walls, a front wall (e.g., a cover for an included fan to cool the pump 220), etc. In some embodiments, a cassette frame 210 can be molded or otherwise formed from plastic or other polymers or composites.

In some cases, the flow connection module 230 can include only the inlet and outlet connection modules 230, 234. For example, the connection modules 230, 234 can be free-floating inlet and outlet fittings or conduits or can otherwise be non-rigidly secured to the cassette frame 210 and the connection modules 230, 234 can then be received and, as appropriate, aligned by corresponding structures of the RPU 160 within the ICD 120. For example, the connection module 150 can include funnels or other tapered structures so that as the cassette is received into the corresponding bay of the ICD 120, the connection module 150 can receive the outlet connection modules 230, 234 with the outlet connection modules 230, 234 within a relatively large range of potential positions (e.g., with a center of either of the connection modules 230, 234 displaced from a nominal centered location by 0.5 times the diameter or greater of the relevant fitting or flow conduit).

In some cases, the connection modules 230, 234 can be secured (e.g., rigidly secured) only to the pump 220 and thus may be only indirectly supported by the cassette frame 210. For example, the pump 220 may be rigidly secured to the cassette frame 210 and the connection modules 230, 234 may extend rigidly from the pump 220, but the connection modules 230, 234 may not be otherwise connected to or supported by the cassette frame 210. In some embodiments, correspondingly, the connection modules 230, 234 can be unified with the pump (e.g., part of a pump housing or included pump inlet or outlet structure) rather than included as separate components.

In some cases, the connection module 150 can be non-rigidly secured within the ICD 120. For example, one or both of the connections 152, 154 can be configured to be moved with the pump cassette 180 as the pump cassette 180 is moved into or out of the house (e.g., between an operational position within the RPU 160 and an installation/uninstallation position that is otherwise located inside or at least partly outside the RPU 160).

In some examples, structures of the pump cassette 180 or of the ICD 120 (e.g., of the RPU 160 within the ICD 120) can be configured to ensure appropriate support for the pump cassette 180 during installation or removal (e.g., in particular relative to the connection modules 150, 230. In some examples, the cassette frame 210 can integrally exhibit cassette support features, or can include separate components that are secured to the cassette frame 210, secured to or included on the pump 220, secured to or included on the connection module 230, etc. to provide such features. Similarly, the RPU 160 within the ICD 120 (or the ICD 120 generally) can include cassette support features for the cassette frame 210, including as can be integrally exhibited on a housing or frame member of the RPU 160 (or the ICD 120 generally) or otherwise secured within the ICD 120.

Cassette support features can variously include: external or internal corners (e.g., of sheet metal frames or structural frame members); grooves or other recesses; protrusions (e.g., rails, pins, detents, hooks, or other non-linear protruding profiles, etc.); rollers (e.g., wheels, bearings, shafts, etc.); slides (e.g., telescoping slides) magnetic systems; levers; hinges; any variety of known systems for aligned movement of drawers or cabinet doors; etc. Thus, for example, the pump cassette 180 can include one or more cassette support features (e.g., features 182, 184 as shown in FIG. 1B) configured variously as a structure of, or attached to, the cassette frame 210, the connection module 230, or the pump 220, including as a corner (e.g., of a sled or bottom support scaffold), as a protrusion or recess, as part of one or more roller assemblies or slides, etc. and the RPU 160 can correspondingly include one or more cassette support features (e.g., features 162, 164 as shown in FIG. 1B) configured, respectively, as a complementary corner guide, as a complementary recess or protrusion, as a complementary one or more roller assemblies or slides, etc., or vice versa.

In some examples, a locking system can be included to secure a pump cassette in an installed (or other) position. In some examples, a locking system can be part of an cassette support system (e.g., can include or use one or more cassette support features). For example, a locking system can secure a pump cassette in an installed position for cooling operations and can also be engaged to actively move the pump cassette into the installed position. In some examples, a locking system can be structured or can otherwise operate separately from a cassette support system.

In some embodiments, a locking system can be arranged to be readily accessed by authorized users from outside an ICD. For example, as shown in FIG. 1B, a locking system for the RPU 160 (e.g., a locking system for retaining the pump cassette 180 within the RPU 160) can include an ICD locking structure 112 and the pump cassette 180 can include a locking structure 186 configured to lockingly engage with the locking structure 112 to secure the pump cassette 180 within the ICD 120 for cooling operations.

In different examples, a variety of locking structures can be used, including: latch or bolt systems, rotary, or linear cam systems, spring-biased catches, or other structures, electronic or magnetic systems, manually or automatically actuated systems, screw locking mechanisms, etc. Thus, for example, the locking structure 186 of the pump cassette 180 can include a rotary cam, spring-biased or lever-operated latch, a threaded rod, or other similar extendable/retractable structure, and the locking structure 112 of the RPU 160 in the ICD 120 (or the ICD 120 generally) can include a corresponding recess, protrusion, or other structure that can lockingly engage with the locking structure 186 of the pump cassette 180, or vice versa. In some examples, as also generally noted above, engagement of such a rotary cam, latch, or other structure on the locking structure 186 with the locking structure 112 can help to urge the pump cassette 180 into a final installed orientation (e.g., via linearized force of a rotating spiral cam, screw, or lever mechanism).

In some embodiments, engagement of relevant locking structures or other similar installation steps can result in enabling or other signals for operation a control system of the ICD 120 and the cooling system 100 generally (e.g., a pump drive, fan drive, or general purpose industrial controller of various known types (not shown)). For example, operation of the pump 220 may not be permitted in some examples until a switch or other sensor (not shown) of known or other configurations is activated to indicate proper engagement of the connection modules 150, 230, proper support of the pump cassette 180 overall, proper engagement of the locking structure 186 and the locking structure 112, or one or more of other satisfactory diagnostic states.

Various other examples of RPUs and related systems are presented below. Unless otherwise indicated, use of similar reference numbers for similarly named components in different examples (e.g., the RPU 160 and an RPU 160A) indicates similar possible structures and functionality for the discussed components. Thus, for example, discussion of the cooling system 100 herein generally also applies—at system and component levels—to other cooling systems 100A, 100B, etc. While the discussion below describes prospective RPUs as installed within cabinets housing air-to-liquid heat exchangers, or liquid-to-air heat exchangers, one of skill in the art will appreciate that RPUs can be provided in a variety of cooling configurations. For example, individual RPUs can be installed in one or more of the racks 110 of FIG. 1A, additionally or alternatively to the RPU 160 installed in the cooling system 100. In some cases, multiple RPUs can be provided along a liquid coolant circuit, to increase a pumping capacity and cooling efficiency along the liquid coolant circuit. Further, RPUs can be provided in cabinets dedicated for liquid cooling, or an RPU can be co-located within a cabinet including electrical components to be cooled (e.g., a cabinet can house a liquid-to-air heat exchanger to cool electrical equipment within the cabinet).

Figure 2:
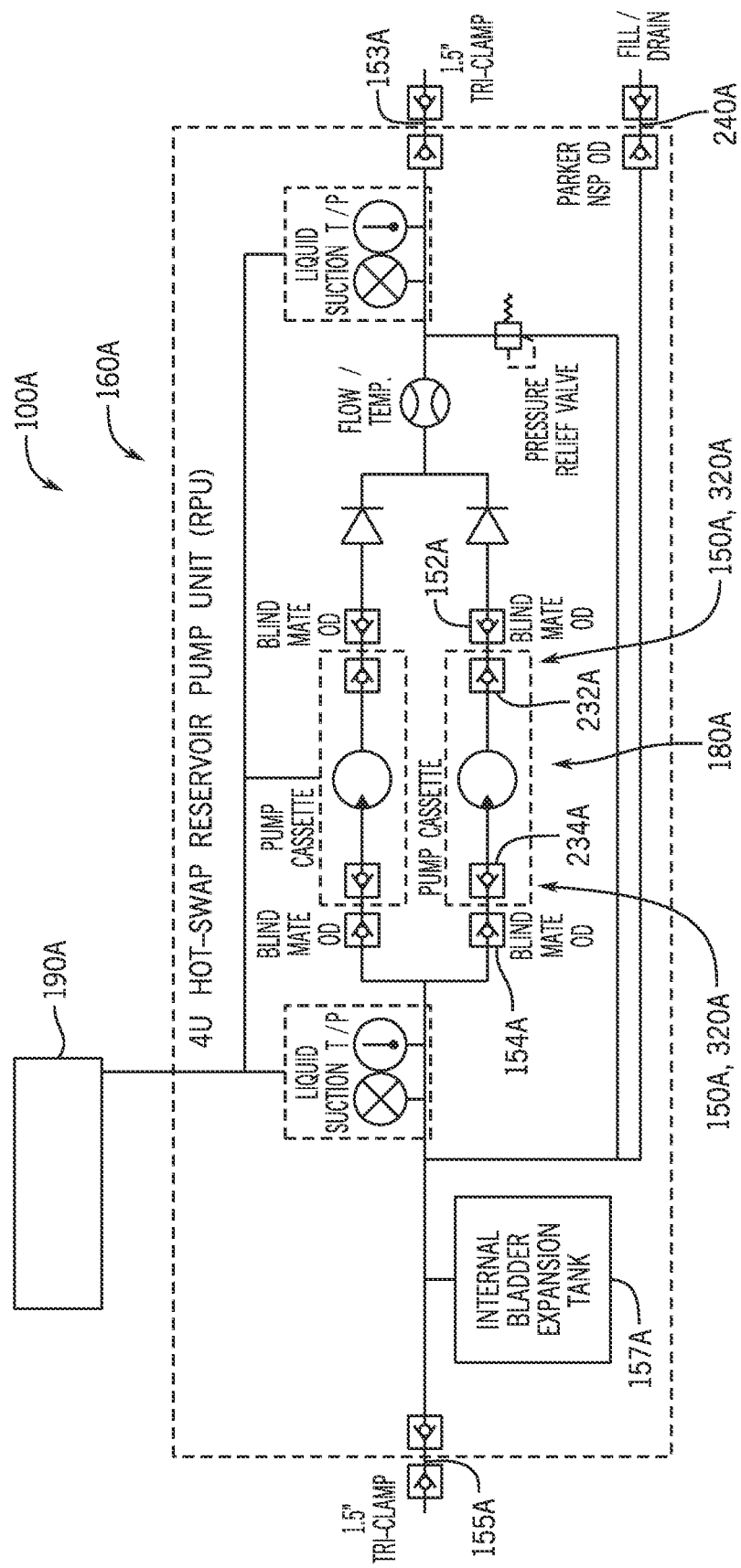
FIGS. 2 and 3 are schematic illustrations of example cooling systems for electrical components, including RPUs with sets of parallel-operation pump cassettes.

FIG. 2 illustrates aspects of an RPU 160A that can be implemented as an example of the RPU 160 (e.g., as discussed above) in a cooling system 100A that is an example of the cooling system 100 (e.g., as discussed above). In particular, the RPU 160A includes two pump cassettes 180A (only one numbered) with blind mate liquid connections 150A, 320A (e.g., with quick-connect inlet fittings 234A, 154A and quick-connect outlet fittings 232A, 152A) so as to be easily installed into or removed from the RPU 160A. As generally discussed relative to the RPU 160, the pump cassettes 180A of the RPU 160A are arranged to operate in parallel with each other to provide pumped cooling flow from an upstream inlet 155A of the RPU 160A to a downstream outlet 153A of the RPU 160A (e.g., both with tri-clamp fittings as shown). Other components can also be included in some cases, including various flow equipment (e.g., an expansion tank 157A as shown to accommodate for thermal expansion and other volume fluctuations), one or more flow sensor packages (e.g., for suction and supply temperature and pressure for the pump cassettes 180A). An electronic controller 190A can also be included (e.g., as part of or in communication with a variable frequency or other drive for the pumps of the pump cassettes 180A), and appropriate communication channels (e.g., for wired communication) can be provided between the controller 190A and the sensors, the pump cassettes 180A (e.g., via quick-connect electrical connections (not shown)), etc. Although shown separately in FIG. 2 (e.g., as may be included within the ICD 120 of FIG. 1A or other associated system), the controller 190A can be partly or fully included on the RPU 160A in some cases (e.g., with a dedicated controller on each of the pump cassettes 180A and a main controller in a cabinet of an ICD includes receives the RPU 160A). In some cases, the controller 190A can be physically located on the RPU 160A and can operate as a main controller for electronic components of the cooling system 100A (e.g., for fans, power supply, pumps, etc.), regardless of whether the electronic components are located internally to the RPU 160A or externally to the RPU 160A. In some cases, as described below, the controller 190A can be one of a pair of controllers housed in the RPU 160A, the pair of controllers being either identical, or comprising programming for separate operating modes of a cooling system (e.g., cooling system 100A) and electronic components thereof. In some cases, a pair of controllers housed in an RPU can provide redundancy, with one controller being a primary controller and the other controller being a backup controller, so that when the primary controller is not in operation (e.g., when the primary controller is removed for maintenance or replacement, or when the primary controller fails), the backup controller assumes control of the system until the primary controller is in operation again.

In some examples, a controller of an RPU can operate the pumps according to control procedures. For example, a user can input desired performance or operating characteristics of a cooling system, and a controller can control a pump speed and/or speeds of fans to achieve the desired values. In some cases, the controller can operate one or more of pump and fan speeds (e.g., a speed of pump 220 illustrated in FIGS. 1 and 2 and fans of fan bank 170 illustrated in FIG. 1) according to a proportional integral derivative controller. For example, a user can set a target temperature value for an outlet of an ICD (e.g., ICD 120) and a controller (e.g., a controller 190 housed in the RPU 160) can iteratively adjust a pump speed and measure a change in temperature to achieve the target temperature. In some cases, a user or system can specify one or more of a target temperature, a target pressure, a target differential temperature (e.g., a differential between a temperature at an inlet and an outlet of a heat exchanger 140), a target differential pressure, or any other value that is measurable by the system. In some cases, a user can control a speed of one or more pumps of an RPU directly by setting pump speed values at an interface of a controller (e.g., a web interface, an ethernet connection, a command line interface, a visual user interface, etc.). In some cases, a controller (e.g., controller 190) can be programmable to control a pump speed according to any algorithm or process determined by an operator of the cooling system 100.

In some cases, elements of a cooling system (e.g., the cooling system 100 or an example thereof) along a flow path of a liquid coolant can be filled with fluid before integration with or operation within the cooling system. For example, air bubbles within a liquid of a liquid coolant in a cooling system can damage components along the flow path and increase a wear on piping and flow control components, including pumps. It can be advantageous to include features within elements of a cooling system to allow the component to be filled with liquid (e.g., charged) before integration with a liquid cooling circuit, so that the component does not introduce air into a flow path of a liquid coolant. In this respect, FIG. 2 illustrates a fill/drain line with a port 240A to facilitate charging of the RPU 160A with a liquid (e.g., water). The port 240A can also be used to drain a fluid from the RPU 160A (e.g., to provide for replacement of a fluid of the RPU 160A or removal or servicing of the RPU 160A and elements thereof). As shown, the port 240A can comprise a quick-connect connection and can be fluidly connected to a fill kit (not shown) for charging or recharging of the RPU 160A with liquid coolant.

Figure 3:
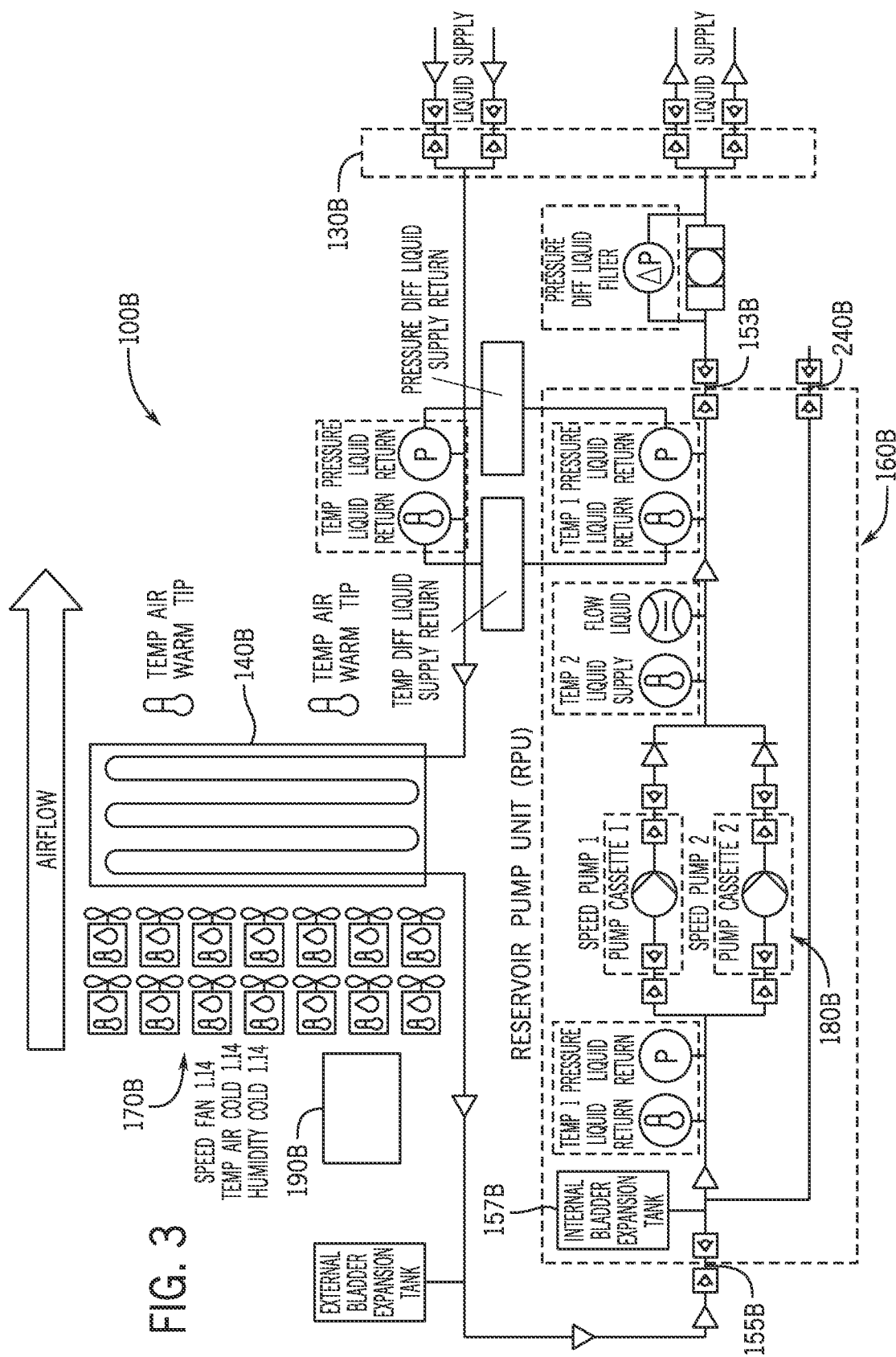

FIG. 3 illustrates aspects of a cooling system 100B that can be implemented as an example of the cooling system 100 discussed above. In particular as shown, the cooling system 100B includes an RPU 160B that is generally similar to the RPU 160A discussed above (see, e.g., FIG. 2), with additional sensor capabilities (e.g., with additional temperature and flow sensors relative to the RPU 160A). The cooling system 100B can accordingly implement cooling operations as similarly discussed above, with pump cassettes of the RPU 160B providing pumping power to distribute cooled fluid to one or more external (or other) electronic systems to be cooled via through a liquid supply and to receive heated fluid from the one or more electronic systems through a liquid return (e.g., as both included in a manifold 130B), as well as to move the heated fluid through a heat exchanger 140B to be cooled by a fan bank 170B. Correspondingly, various operations of the cooling system 100B can be controlled by an electronic controller 190B, including as may coordinate pump speed and fan speed based on data from the various illustrated (or other) sensors. Further, the RPU 160B can also include a fill/drain line including a fill/drain port 240B for charging or draining the RPU 160B, as described with respect to port 240A of FIG. 2.

Figure 4:
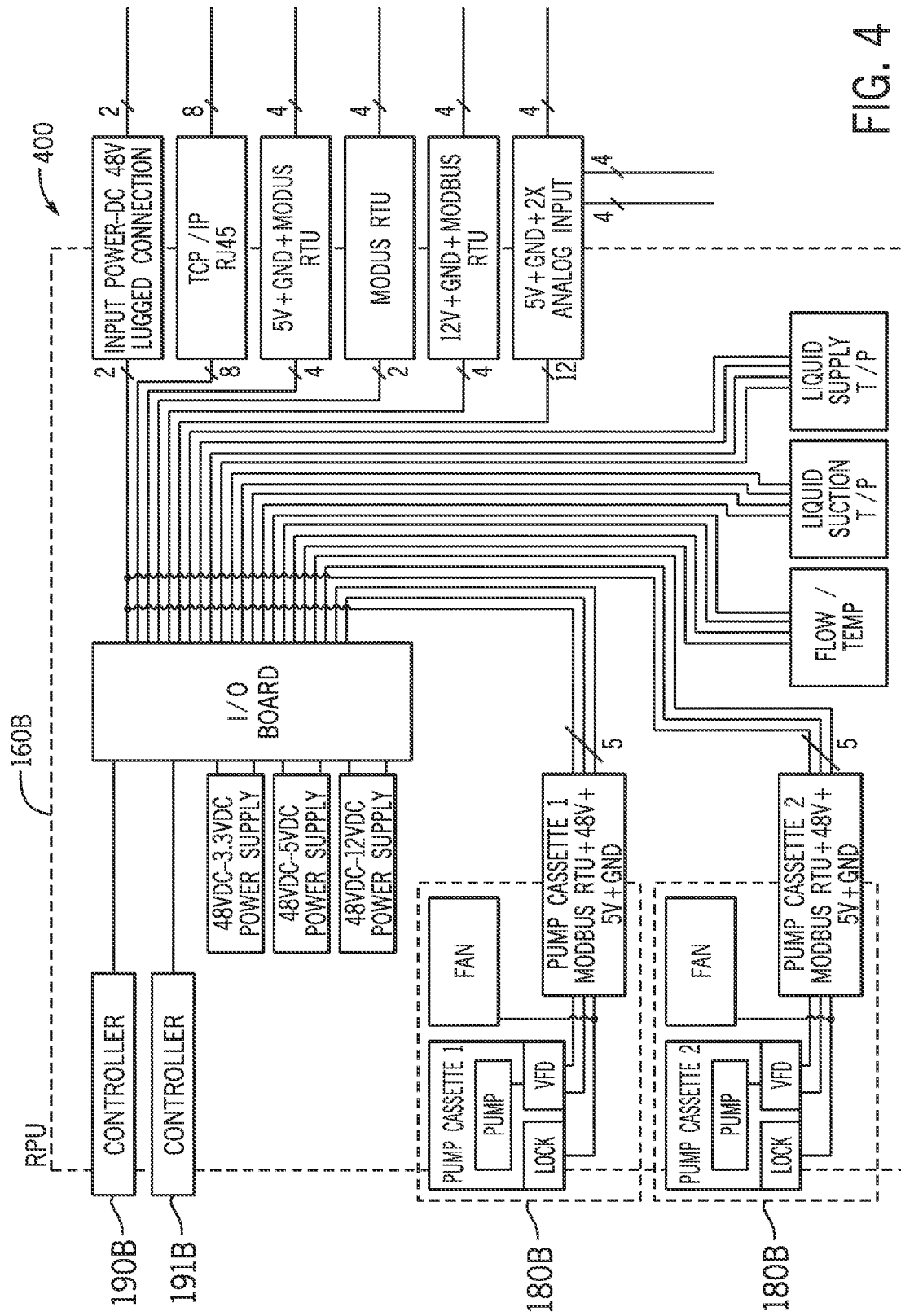
FIG. 4 is a schematic illustration of a control system for the cooling system of FIG. 3.

FIG. 4 illustrates an example schematic of a control system 400 for the cooling system 100B of FIG. 3. In the illustrated example, the control system 400 includes dedicated variable frequency drives for the pumps that are included on the respective pump cassettes 180B, as well as integrated power supplies with different output voltages, electronic communication connections between the pump cassettes 180B and other architecture of the control system 400, including various sensors (e.g., as discussed above) and the controller 190B. In some cases, a control system (e.g., control system 400) can also include electronic components that are external to the RPU 160B, including, for example, fans of a fan bank (e.g., fan bank 170 illustrated in FIG. 1, fan bank 170B illustrated in FIG. 3). Further, the control system 400 can include a secondary controller 191B, so that the controller 190B can be one of a pair of redundant controllers, as described above.

Figure 5:
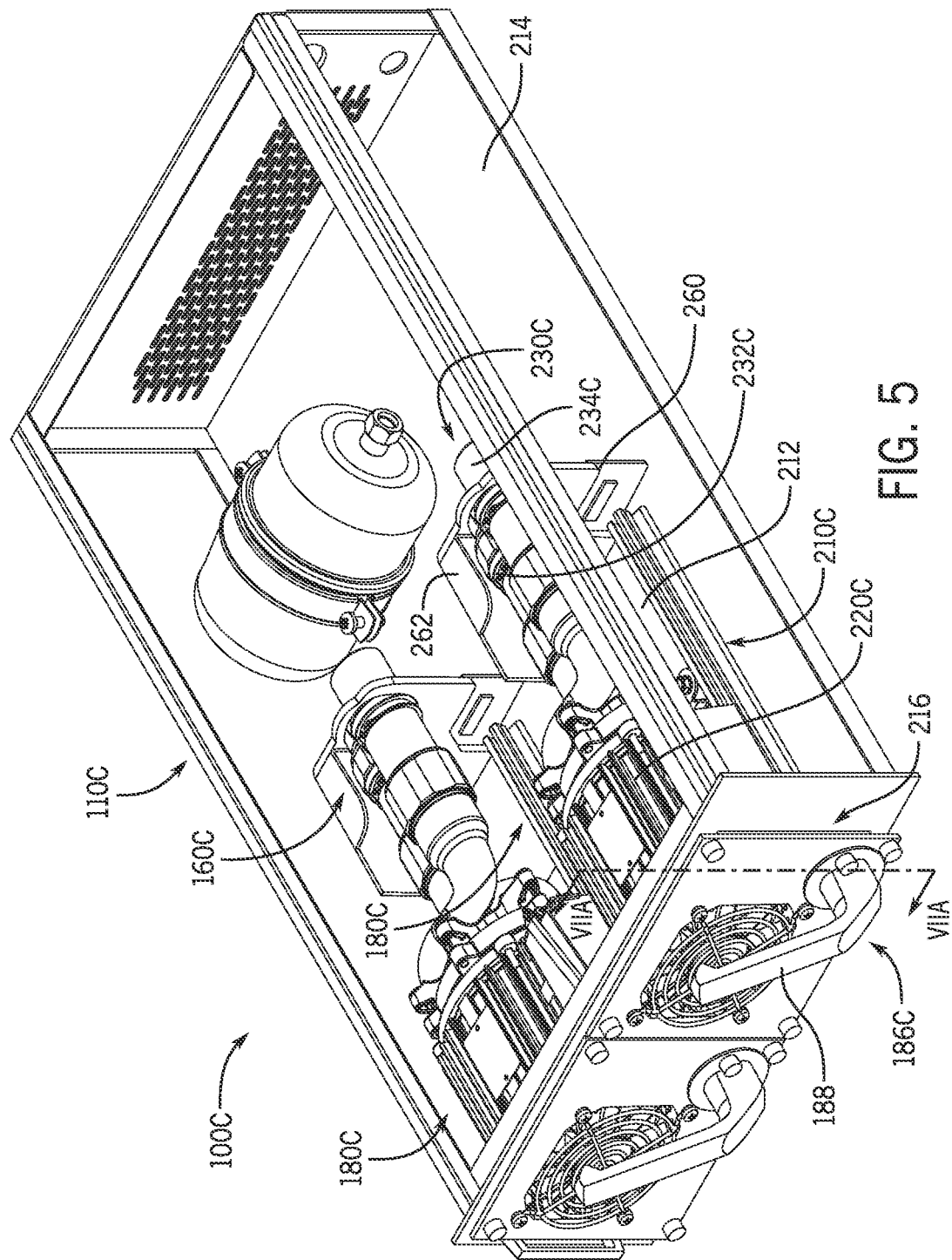
FIGS. 5 and 6 are perspective partial views of an example cooling system for electrical components, including an RPU with a set of parallel-operation, hot-swappable pump cassettes.

FIG. 5 shows aspects of an RPU 160C that can be implemented as an example of the RPU 160 (e.g., as discussed above) in an ICD 120C of a cooling system 100C that are examples of the ICD 120 and the cooling system 100 (e.g., as discussed above). In the illustrated example, the RPU 160C includes a set of two substantially identical pump cassettes 180C, each of which include a cassette frame 210C that supports a pump 220C and associated drive motor and cooling fan, and also supports a flow connection module 230C with an inlet connection 232C and an outlet connection 234C. While numbering is only shown for one of the pump cassettes 180C, it should be understood that the description of the numbered pump cassette 180C is equally applicable to the pump cassette 180C not including numbering.

The flow connections 232C, 234C can generally include known types of quick-connect fittings or other connection structures as generally described above and can be supported by the cassette frame 210C to be appropriately aligned for engagement with corresponding connection modules on the RPU 160C (not shown). In particular, the flow connection modules 232C, 234C are supported relative to the cassette frame 210C by upstanding plate brackets 260 with support gussets 262 that provide further structural stability and shielding for the flow connection modules 232C, 234C. In other embodiments, however, a variety of other support arrangements (e.g., other direct support arrangements or various indirect support arrangements). For example, the flow connection modules 232C, 234C may not be directly supported by the cassette frame 210C in some cases. As also noted above, electrical connections (e.g., electrical quick-connect connections of various known types) can also be provided, including as can provide power or control signals for the pumps 220C (e.g., for variable frequency drives to control pump speed), and other electronic elements of the pump cassettes 180C, which can include, for example, LEDs, sensors, locking mechanisms and switches, etc.

In the illustrated example, the cassette frame 210C is formed primarily as a sled with a sled base 212 formed as a support platform of bent sheet metal with upwardly angled sides and a central support region that directly supports the associated pump 220C and the associated flow connection modules 232C, 234C (e.g., via the plate bracket 260 as shown). The sled base 212 of the pump cassette 180C is configured to slide directly on a base plate 214 of the RPU 160C so that the base plate 214 and the RPU 160C as a whole generally guides the sled base 212 for movement between installed and uninstalled positions. For example, the sled base 212 can be sized for guiding contact with edges of an opening 216 in a front plate of the RPU 160C or guiding contact with other guide features of the RPU 160C (e.g., features integrally formed with the base plate 214, or fixedly secured thereto). In some cases, the sled base 212 can include integral or otherwise connected (but non-integral) features that can help to appropriately align the pump cassette 180C generally or the flow connection modules 232C, 234C in particular. In some examples, as also generally noted above, the flow connection modules 232C, 234C or other features on the pump cassette 180C can exhibit a floating configuration and corresponding flow connections on the RPU 160C can be configured to receive and align the flow connection modules 232C, 234C for cooling operations. Additionally or alternatively to including dedicated attached or integral cassette support features, a pump cassette can be configured to be moved into (and secured in) for cooling operations by a locking mechanism, including as further discussed below.

Figure 7A:
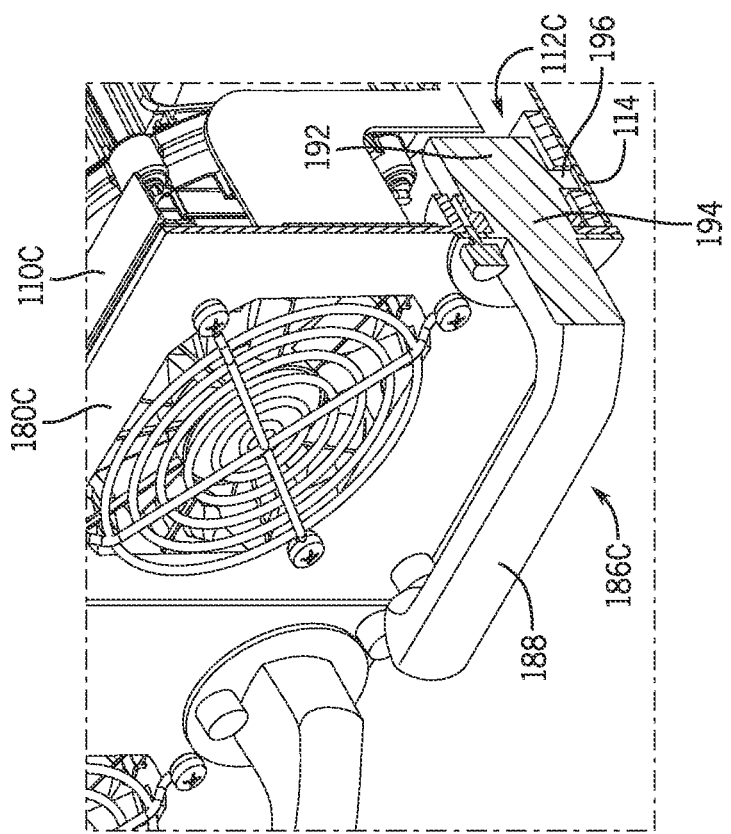
Figure 7B:
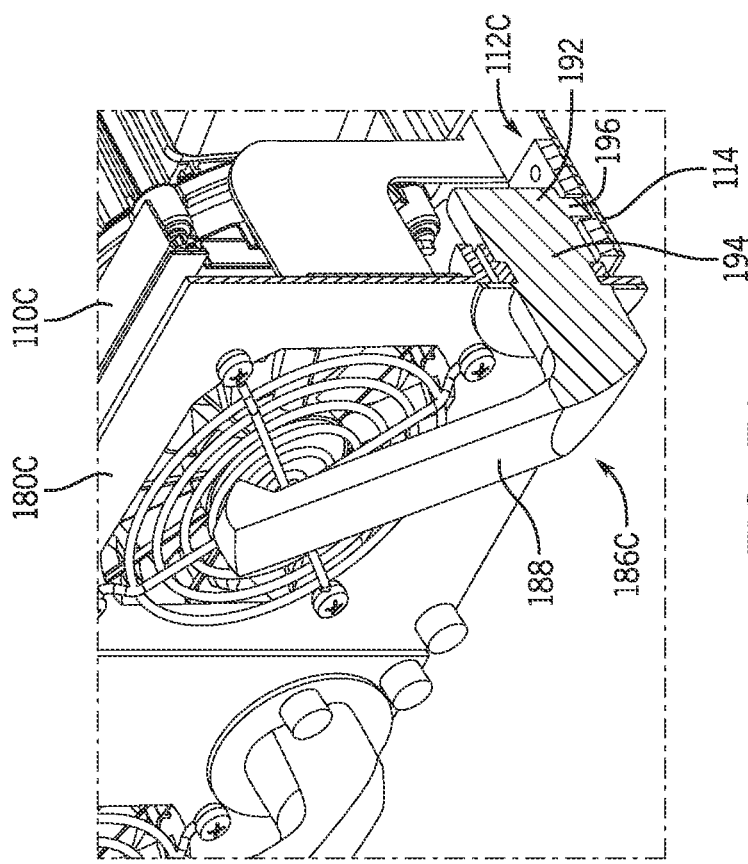

Referring now also to FIGS. 7A through 9C, the pump cassette 180C includes a rotating locking mechanism by which a rotational input by a user locks the pump cassette 180C in an installed (and operational) position. In the illustrated example, the locking mechanism of the pump cassette 180C can also help to complete insertion and support of the pump cassette 180C with respect to the ICD 120C, although other configurations may not necessarily permit such functionality. In particular, as shown in FIGS. 7A and 7B, the pump cassette 180C includes a locking structure 186C that includes a handle 188 that is accessible for rotation from outside the RPU 160C and that is attached to an internal locking cam 192. The locking cam 192 includes a cylindrical base 194 that extends from the handle 188 and a spiral cam protrusion 196 that protrudes generally radially from the cylindrical base 194, as additionally shown in FIG. 8A.

Figure 8B:
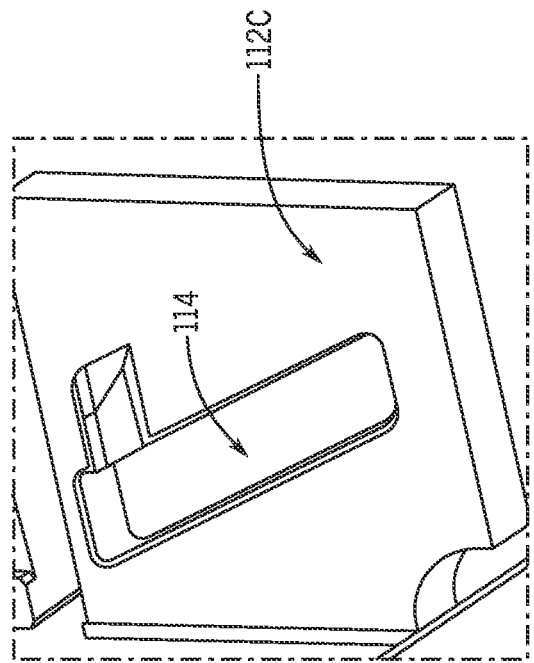
Figure 8A:
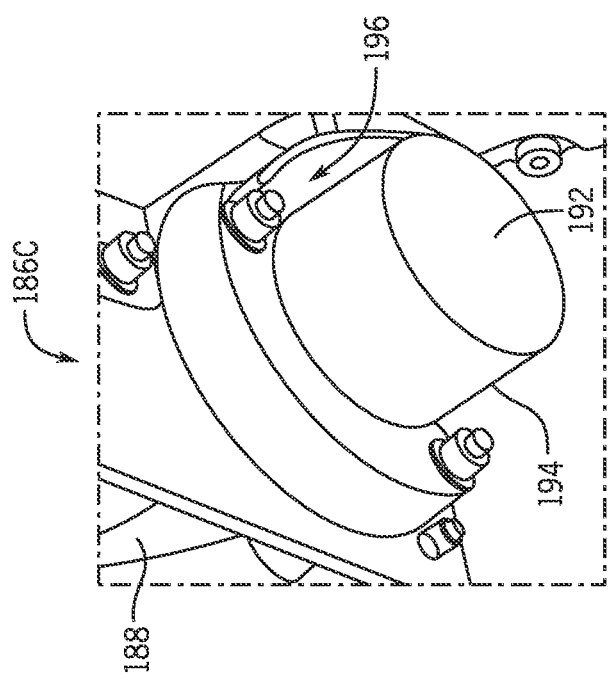

Referring back to FIGS. 7A and 7B, on the RPU 160C, a corresponding locking structure 112C can include a slot 114 configured to engage the cam protrusion 196 in a locking and cassette support engagement (e.g., as shown in FIG. 8B). In particular, in the illustrated example, the slot 114 is transversely and obliquely angled relative to an insertion direction of the pump cassette 180C. Accordingly, as illustrated in FIGS. 9A through 9C, the slot 114 can engage the cam protrusion 196 once the cassette 180C has been inserted through the opening, as the handle is rotated from an unlocked position (e.g., fully vertical) through an intermediate position (see FIGS. 7A, 9A, and 9B) to a locked position (see FIGS. 7B and 9C), to pull the cassette 180C into appropriate support for coolant flow from the connection module 230C into the ICD 120C and to lock the cassette 180C into the aligned (installed and operational) position. In other embodiments, other locking arrangements can similarly secure a cassette or can similarly urge a cassette into operational support, including as may be implemented via other rotational or non-rotational cammed arrangements, via lever mechanisms, pins, latches, etc. In some cases, a locking arrangement can itself be secured in a particular (e.g., locked) configuration, including using fasteners, detents, clasps, or other devices.

In some cases, a locking arrangement (or other subsystem) can include stops to prevent over-insertion of components of an RPU. For example, as shown in FIGS. 9B and 9C, the locking structure 112C includes a stop 116 that can prevent over-insertion of the pump cassette 180C while also providing provide contact (e.g., tactile) feedback to a user that can indicate that the pump cassette 180C is positioned for locking operations using the locking structures 186C, 112C. Similar or otherwise configured stops can be arranged to provide similar stop functionality in other cases, or to provide other operational stops (e.g., relative to locking or unlocking rotation of the handle 188 or other locking component).

Figure 10:
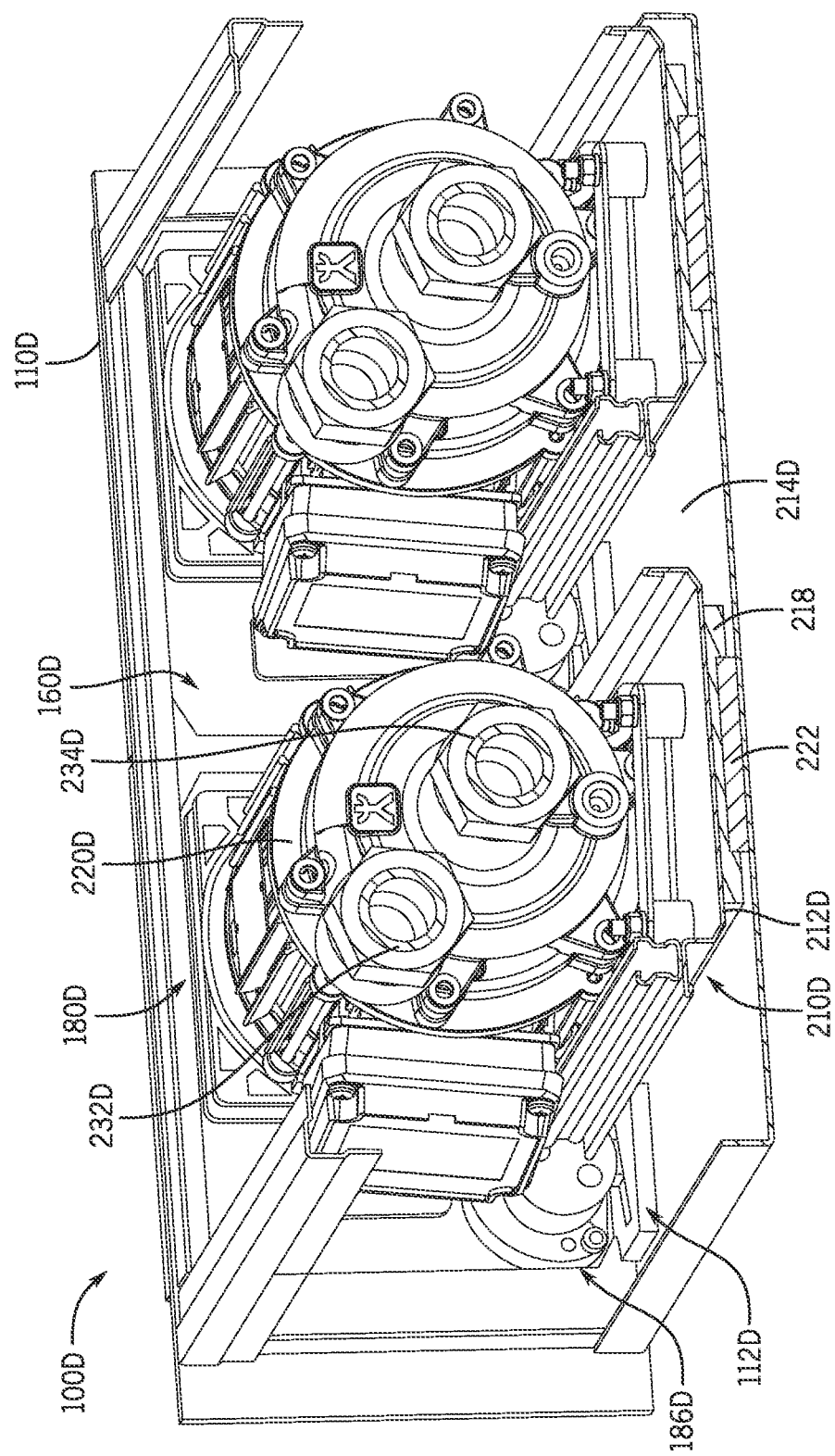
FIG. 10 is a perspective partial view of an example cooling system for electrical components, including an RPU with a set of parallel-operation, hot-swappable pump cassettes.

FIG. 10 shows aspects of an RPU 160D that can be implemented as an example of the RPU 160 (e.g., as discussed above) in an ICD 120D of a cooling system 100D, which can be examples of the ICD 120 and the cooling system 100 (e.g., as discussed above). In general, the RPU 160D is similar to the RPU 160C (see, e.g., FIG. 5), including relative to a pump cassette 180D with a cassette frame 210D formed to include a sheet metal sled base 212D, and relative to locking structures 186D, 112D arranged as a rotational cam system that can both lock and align the pump cassette 180D (e.g., similar to the locking structures 186C, 112C discussed above).

In some aspects, however, the RPU 160D differs from the RPU 160C. For example, a guide member 218 is secured to the cassette frame 210D at the sled base 212D and a corresponding (e.g., complementary) guide member 222 is secured to a base plate 214D of the RPU 160D. In particular, the guide member 218 defines two protrusions on opposing sides of a channel, and the guide member 222 is a rail secured to the base plate 214D to provide a protrusion from the base plate 214D that is complementary to the guide member 218 (with appropriate clearance for sliding movement). Thus, for example, contact between the guide members 218, 222 can help to guide translational movement of the pump cassette 180D during installation or removal of the pump cassette 180D relative to the ICD 120D, and can limit or restrict a lateral movement (e.g., a horizontal movement perpendicular to the insertion direction) of the pump cassette 180D.

In the illustrated example, squared protrusions and a squared recess are provided, but other configurations are possible, and some embodiments can include more or fewer protruding (or other) guide structures. Further, although the guide members 218, 222 extend continuously over substantially all of the length of the pump cassette 180D as shown, some examples can include guide features that extend non-continuously along a pump cassette or other RPU structure, or that extend along only part of an entire length of a pump cassette (e.g., collectively over less than 80%, less than 60%, less than 50%, or less than 30% of a relevant length).

Further, reversed arrangements may be possible in some cases (e.g., with a guide recesses on an RPU that receives a guide protrusion on a pump cassette), as well as other possibilities discussed above.

As another example of differences relative to the RPU 160C, the sled base 212D of the pump cassette 180D pump does not directly support an inlet connection 232D and an outlet connection 234D for an associated pump 220D. Rather, inlet and outlet structures (e.g., the inlet connection 232D and outlet connection 234D) with various types of known plumbing fittings or other components (not shown) can extend from the inlets and outlets of the pump 220D and can be directly supported only by the pump 220D (or other structures not including the sled base 212D), rather than being supported by brackets, gussets or other similar structures that extend from the sled base 214D (e.g., in contrast to the brackets 260 and gussets 262 shown in FIG. 5).

Figure 11:
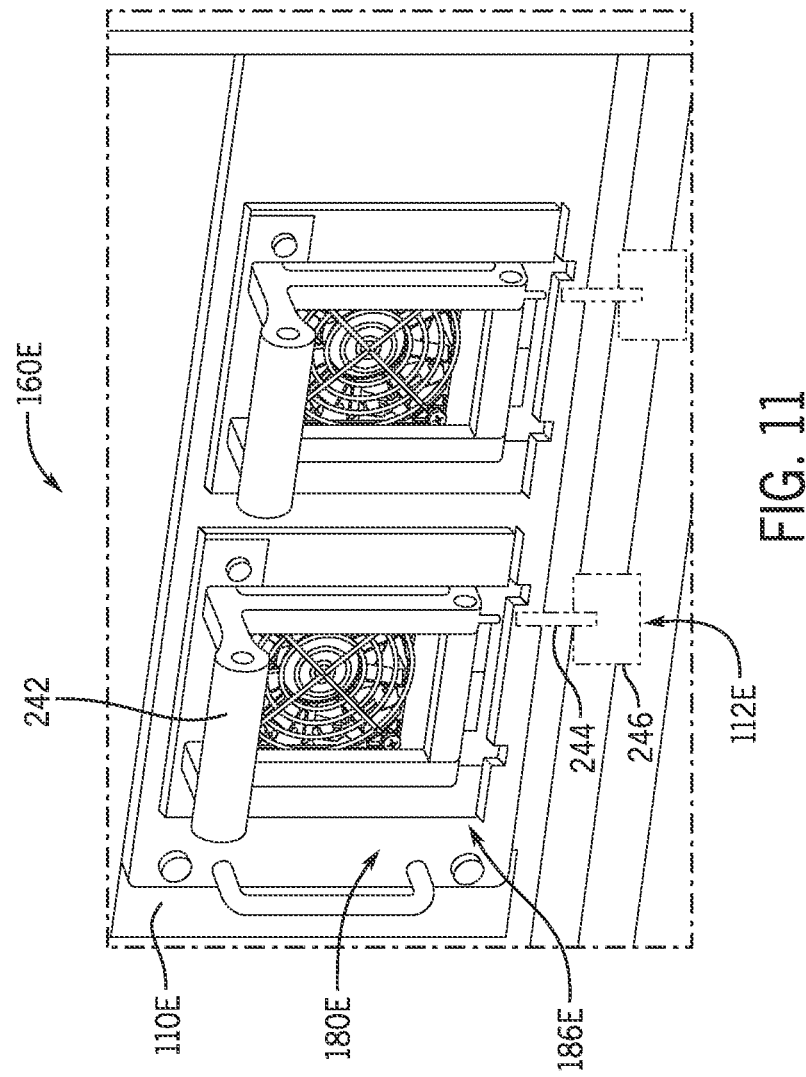
FIG. 11 is a perspective partial view of locking of pump cassettes of an RPU including locking arrangements thereof.

FIG. 11 shows aspects of another RPU 160E that can be implemented as an example of the RPU 160 (e.g., as discussed above). The RPU 160E is generally similar to the RPUs 160C, 160D discussed above, including relative to support structures and powered equipment, but differs in some respects. For example, a locking mechanism of a pump cassette 180E of the RPU 160E can include a handle configured as a lever 242 that hinges about an axis (e.g., a fixed horizontal axis, as shown) to move a pin 244 between a locked configuration (as shown in FIG. 11) and an unlocked configuration (not shown). Thus, via movement of the lever 242, the pin 244 can be moved to permit or prevent the pump cassette 180E from being removed from the RPU 160E. In some examples, the pin 244 or other structure associated with the lever 242 can be configured to move the pump cassette 180E into position for cooling operations (e.g., generally similarly to the locking structures 186C, 112C discussed above). In some embodiments, a sensor 246 (e.g., a contact switch or other proximity sensor) can sense the position of the lever 242 and can send corresponding control signals to a controller (e.g., to indicate that the pump cassette 180E is or is not properly locked and thus is or is not ready for cooling operations). In different embodiments, any variety of known sensors can be used for a similar purpose, and similar sensor systems can be implemented relative to other RPUs discussed herein.

Figure 12A:
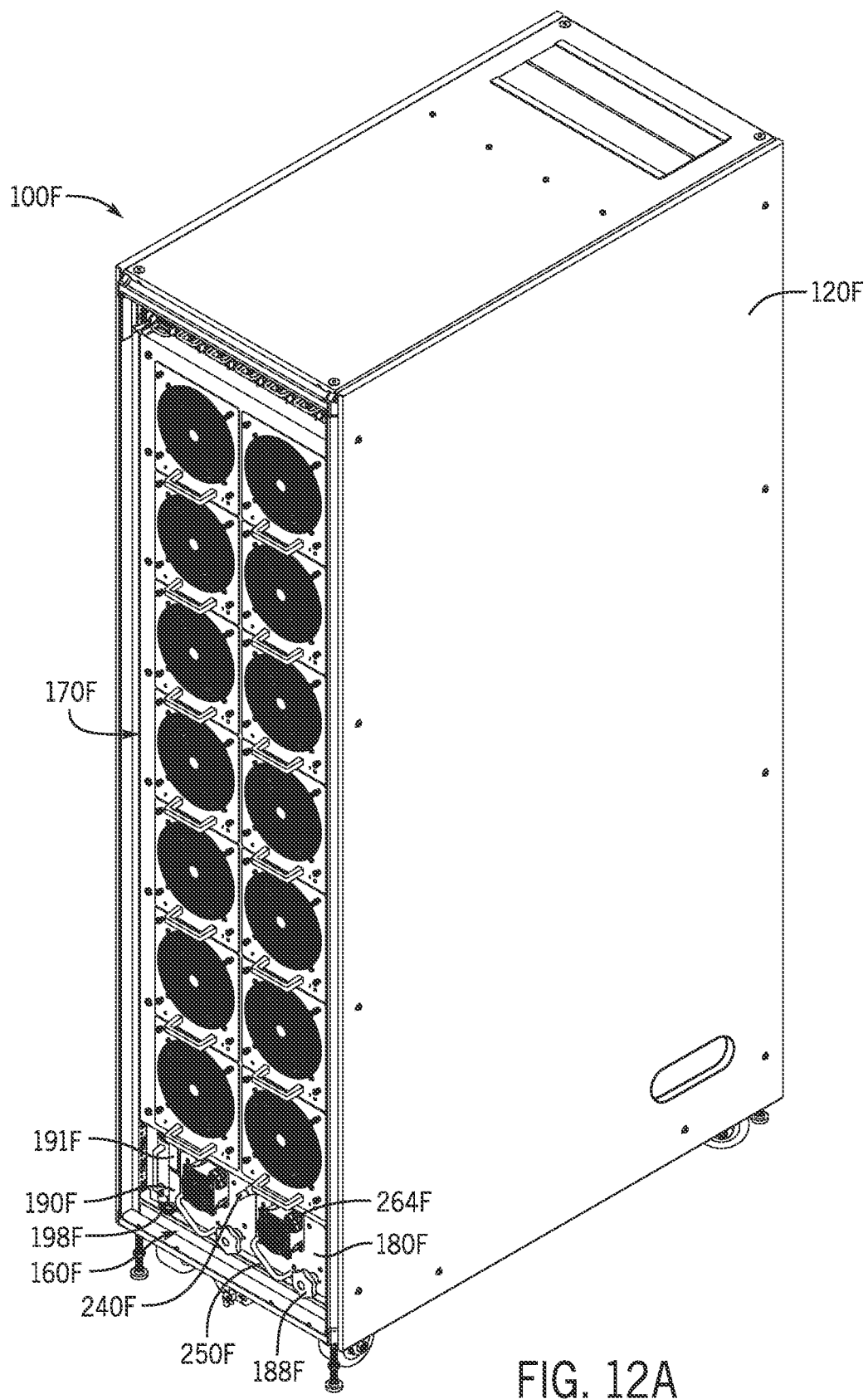
FIG. 12A is a perspective partial view of an example cooling system for electrical components, including an RPU with a set of parallel-operation, hot-swappable pump cassettes.
Figure 12B:
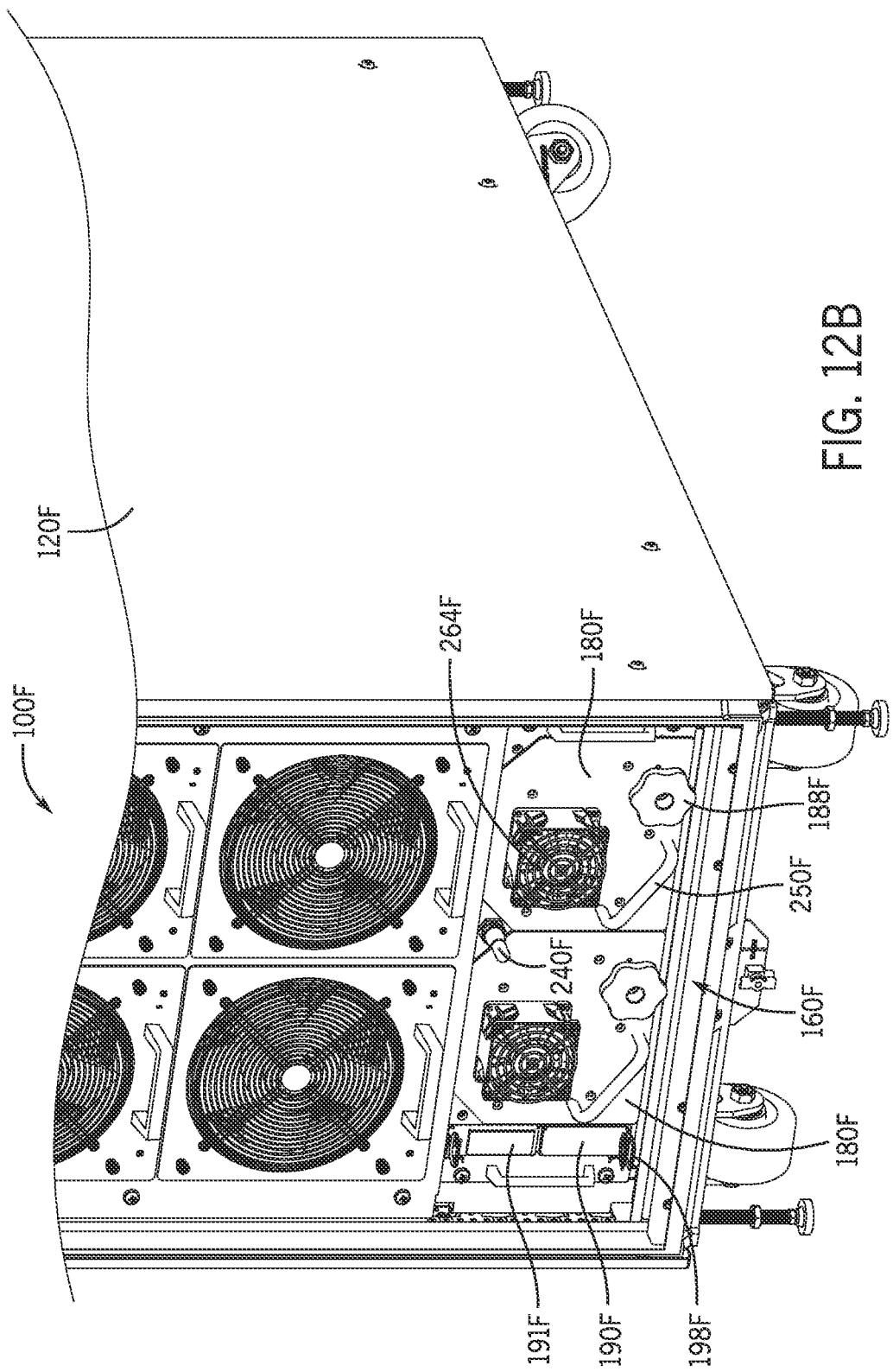
FIG. 12B is a perspective partial view of the pump cassettes and locking arrangements thereof of the cooling system of FIG. 11A.

FIGS. 12A and 12B show aspects of another cooling system 100F with an ICD 120F and an RPU 160F that can be implemented as an example of the cooling system 100, the ICD 120, and the RPU 160 (e.g., as discussed above). The RPU 160F is generally similar to the RPUs 160C, 160D discussed above, including relative to support structures and powered equipment, but differs in some respects. For example, a locking mechanism of a pump cassette 180F of the RPU 160F can include a rotatable knob 188F which can be rotated by a user in a first direction (e.g., clockwise) to secure the pump cassette 180F within the RPU 160F in a locked configuration and can be rotated in a second direction opposite the first direction (e.g., counter-clockwise) to move a retention mechanism of the RPU 160F to an unlocked configuration. In some examples, as further described below, retention mechanisms (not shown) of the pump cassette 180F and the RPU 160F can engage to move the pump cassette 180F into position for cooling operations when the knob 188F is rotated to place the retention mechanism in a locked configuration. Pump cassettes 180F of the RPU 160F can include features to assist in installation and removal of the cassette 180F. For example, as shown, the pump cassettes can include a handle 250F to provide a location for an operator to grip the pump cassette 180F when removing or installing the cassette 180F. In some embodiments (e.g., including as described below with respect to FIG. 20), pump cassettes 180F can include additional handles and gripping features, as can allow for two-handed engagement of an operator with the cassette. Further, the pump cassettes 180F can include fan modules 264F for cooling components of the respective pump cassette 180F (e.g., a pump of the pump cassette 180F). The fan module 264F can operate to blow air across components of the pump cassette in a direction toward a rear of the RPU 160F (e.g., towards a hot aisle of a data center, in an insertion direction of the pump cassette 180C).

Ports for filling or draining fluid from an RPU can be provided in an easily accessible location, to allow servicing of the RPU and charging of the RPU from a cold aisle of a data center. As further shown in FIGS. 12A and 12B, a liquid port 240F (e.g., similar to port 240A shown in FIG. 2 and port 240B shown in FIG. 3) can be provided at a front face of the RPU 160F. The port 240F can comprise a quick-connect connection to allow hosing of a liquid fill/drain kit (not shown) to connect to the port 240F to charge the RPU 160F and components thereof, or to drain a fluid from the RPU 160F. In some embodiments, including as described with respect to FIGS. 25 and 26, one or more liquid ports can be provided in a rear of an RPU, to allow servicing from a rear of a cabinet in which the RPU is installed (e.g., a hot aisle within a data center). Further, the illustrated embodiment of FIGS. 12A and 12B includes only one port, however, in other embodiments, more than one port can be provided for a liquid fill/drain line.

In some cases, as described above, an RPU can include control systems for controlling operation of a cooling system. The control systems can include local control elements of components (e.g., pumps) within the RPU, and can include controllers which can be in communication with elements of an ICU (e.g., fans of the fan bank 170 illustrated in FIG. 1). As further shown in FIGS. 12A and 12B, the RPU 160F can include a removable controller 190F. The controller 190F can be mounted in a slot of the RPU 160F and can include a handle 198F to facilitate easy removal and insertion of the controller 190F from the RPU 160F. In some cases, the handle 198F can engage a retention mechanism for the controller 190F, and removal of the controller 190F can require a vertical displacement of the handle 198F to disengage the retention mechanism before removal of the controller 190F in a direction opposite the insertion direction of the controller 190F. As further shown, the RPU 160F can include a second controller 191F, which can be substantially identical to the controller 190F with regard to mechanical features. In some cases, a programming of each of the controllers 190F, 191F can be substantially similar (e.g., identical). In some cases, one of the controllers 190F, 191F is a primary controller, and the other of the controllers 190F, 191F is a backup controller. The primary controller can operate to control electrical components of the ICD 120F when in operation. When the primary controller is removed or otherwise is uncommunicative with electronic components of the ICD 120F (e.g., when the primary controller fails), the backup controller can assume control of the electrical components of the ICD 120F until the primary controller resumes operation. In some cases, the controllers 190F, 191F can be differently programmed, and can each include instructions for implementing different operating modes from the other of the controller 190F, 191F. In some cases, an operator can select one of the controllers 190F, 191F to be a primary controller. The controllers 190F, 191F can include interfaces (e.g., TCP/IP, Modbus, ethernet, etc.

as described with respect to FIG. 4) to allow interaction with other electrical components of the ICD 120F and can further allow an operator of the ICD 120F to connect to either or both of the controllers 190F, 191F to read operating parameters therefrom, or to set values (e.g., set points for target temperatures, target pressures, maximum and minimum values for operating parameters, etc.). Further, the controllers 190F, 191F can be hot-swappable, and the cooling system 100F can continue operation when one of the controllers 190F, 191F is removed, without interruption to an operation of the cooling system 100F.

Figure 13:
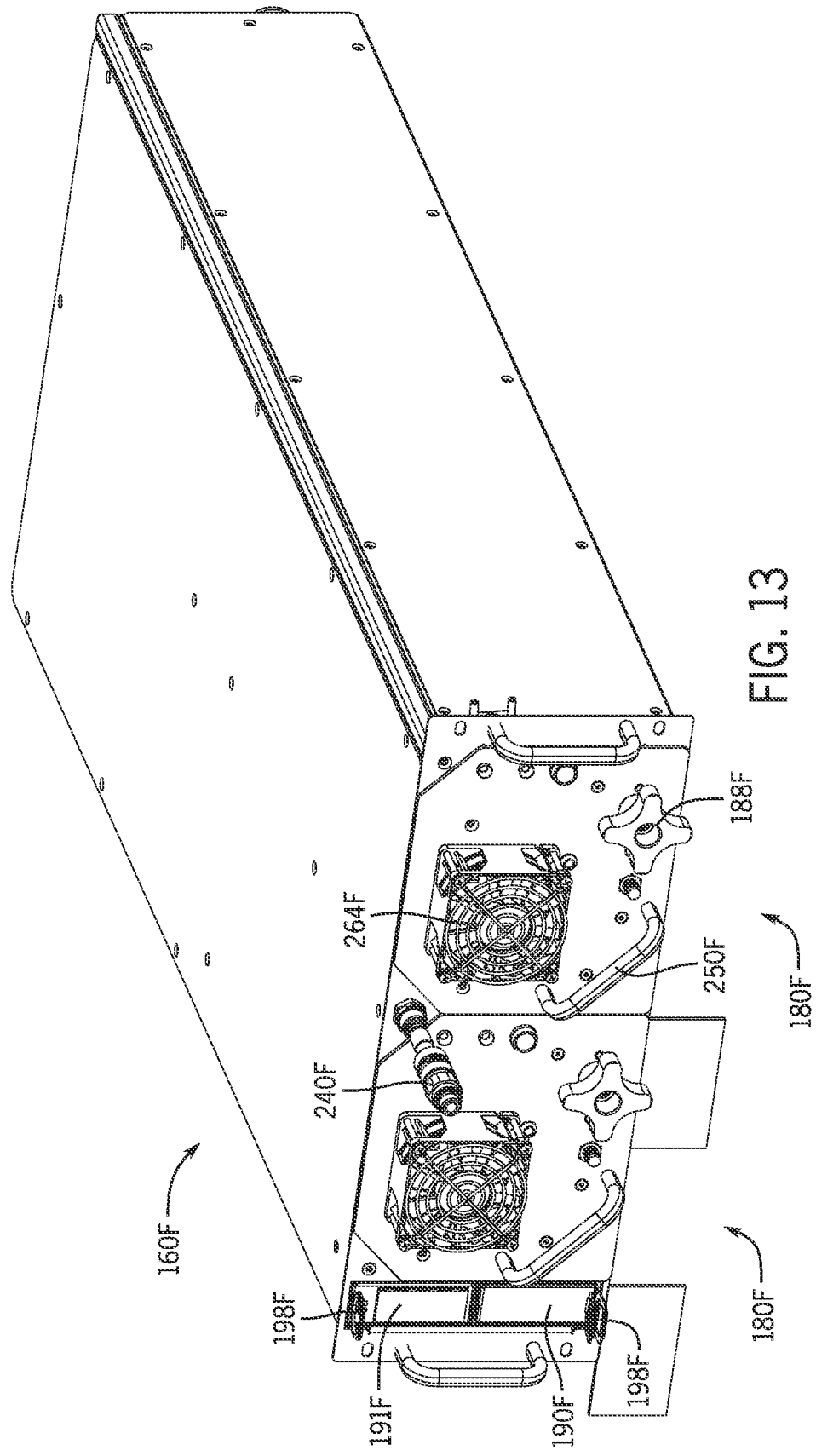
FIG. 13 is an isometric view of an example cooling system for electrical components, including an RPU with a set of parallel-operation, hot-swappable pump cassettes.

FIG. 13 further illustrates aspects of the RPU 160F, showing the RPU 160F isolated from the cooling system 100F and the ICD 120F. One of skill in the art will appreciate that the RPU 160F can be used in liquid cooling systems of a different configuration than the cooling system 100F and ICD 120F. For example, the RPU 160F, as shown, has a height of four rack units (e.g., 4 U), as can occupy four standard slots in cabinets of a data center. The RPU 160F can thus be installed in any cabinet with four consecutive available slots and can pump fluid along a liquid coolant circuit. In some cases, a cabinet in which the RPU 160F is installed can include heat exchange elements (e.g., the cabinet can be a liquid-to air cooling unit, an air-to-liquid cooling unit, can house a liquid-to-air heat exchanger, or can be integrated with a rear-door liquid-to-air heat exchanger). In some cases, the RPU 160F can be installed in a cabinet not including heat exchange components and can function to induce flow along a liquid cooling circuit either alone, or in coordination with other RPUs.

Figure 6:
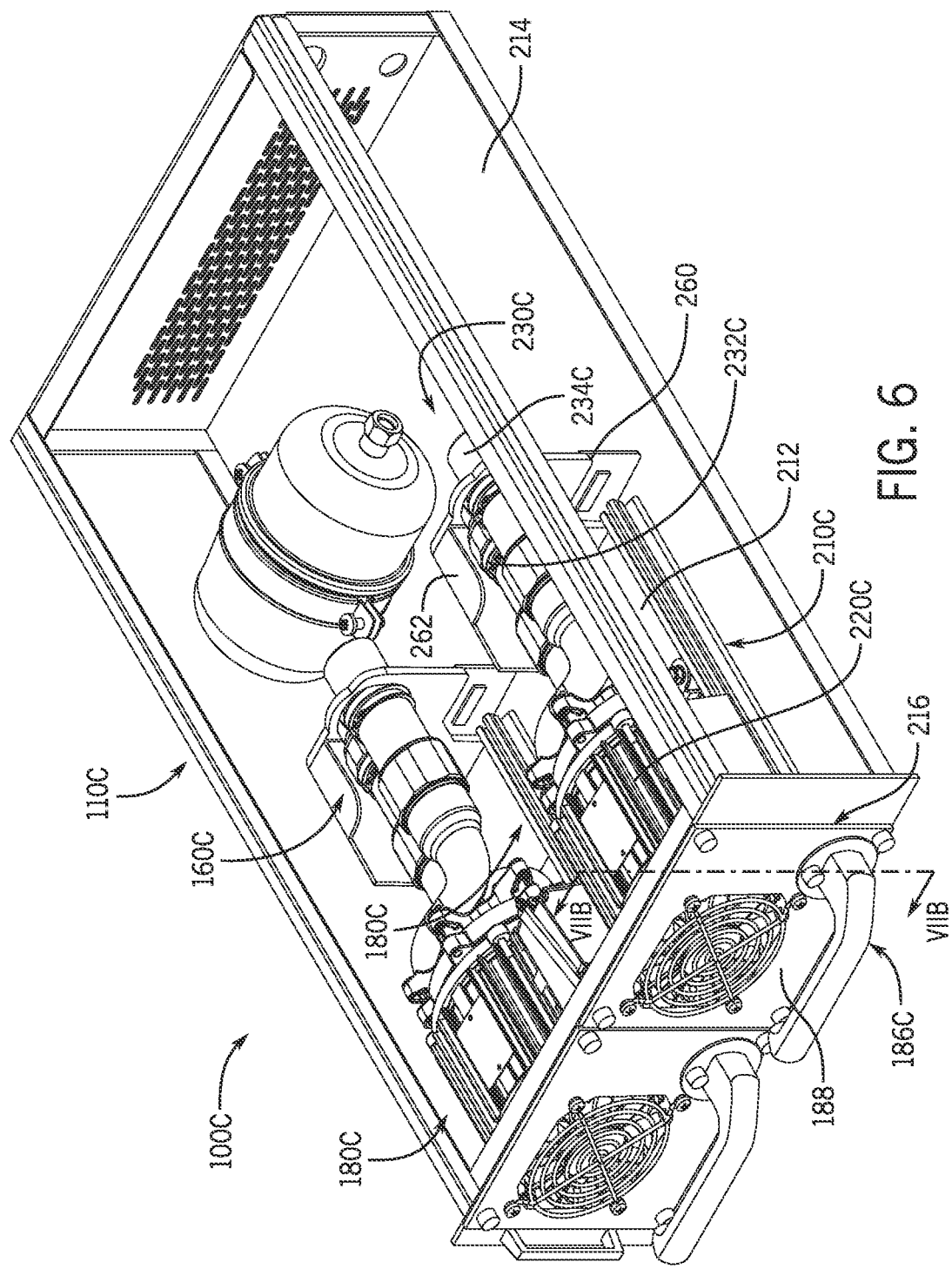
Figure 14:
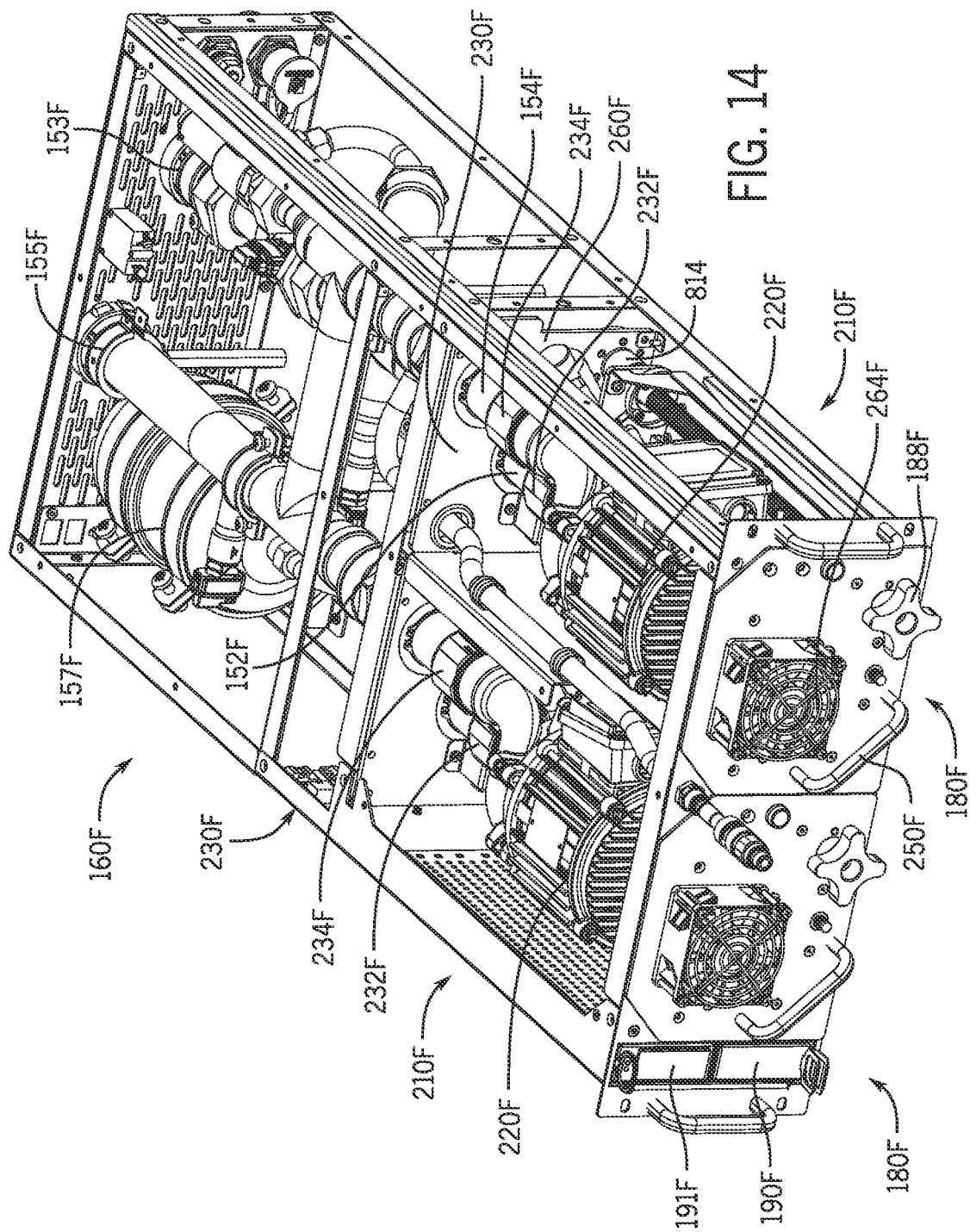
FIG. 14 is an isometric view of the RPU of FIG. 13, with panels of the RPU removed to show internal components of the RPU.

Referring now to FIG. 14, as described with respect to RPU 160C illustrated in FIGS. 5 and 6, each pump cassette 180F can include a cassette frame 210F that supports a pump 220F and associated drive motor and the cooling fan 264F, and also supports a flow connection module 230F with an inlet connection 232F and an outlet connection 234F, as examples of the inlet connection 232 and outlet connection 234 described with respect to FIG. 1. The flow connections 232F, 234F can generally include known types of quick-connect fittings or other connection structures as generally described above. As shown, the flow connections 232F, 234F of the flow connection module 230F are supported by the pump 220F (e.g., similar to flow connections 232D, 234D of pump cassette 180D shown in FIG. 10). In some examples, upstanding plate brackets can be provided on an RPU (e.g., alternatively or additionally to providing a support plate on a pump cassette, as shown in FIG. 6). Plate brackets of an RPU can support connection modules of the RPU for positioning with connection modules of pump cassettes inserted into the RPU. As illustrated, for example, the RPU 160F includes an upstanding plate bracket 260F for supporting elements of the RPU 160F including inlet connection F and outlet connection 154F. The plate bracket 260F can support the connections 152F, 154F at a location to be appropriately aligned for engagement with corresponding connections 232F, 234F of the pump cassette 180F. As also noted above, electrical connections (e.g., electrical quick-connect connections of various known types) can also be provided, including as can provide power or control signals for the pumps 220F (e.g., for variable frequency drives to control pump speed).

In some cases, cassette support features and mechanisms can be provided in an RPU to support and align a pump cassette within an RPU. Providing cassette support features on only one of the RPU or pump cassette can simplify insertion and removal of a pump cassette from the RPU and can further simplify a manufacturing process for RPUs. It can be advantageous to minimize cassette support features built into a pump cassette, for example, to reduce a manufacturing cost, as a pump cassette is likely to be replaced with more frequency than a frame of an RPU. Further, cassette support features of an RPU can rely on gravity to prevent a vertical displacement of the RPU, which can eliminate a need for rails or other mechanisms on a pump cassette or RPU to ensure vertical positioning.

Figure 15:
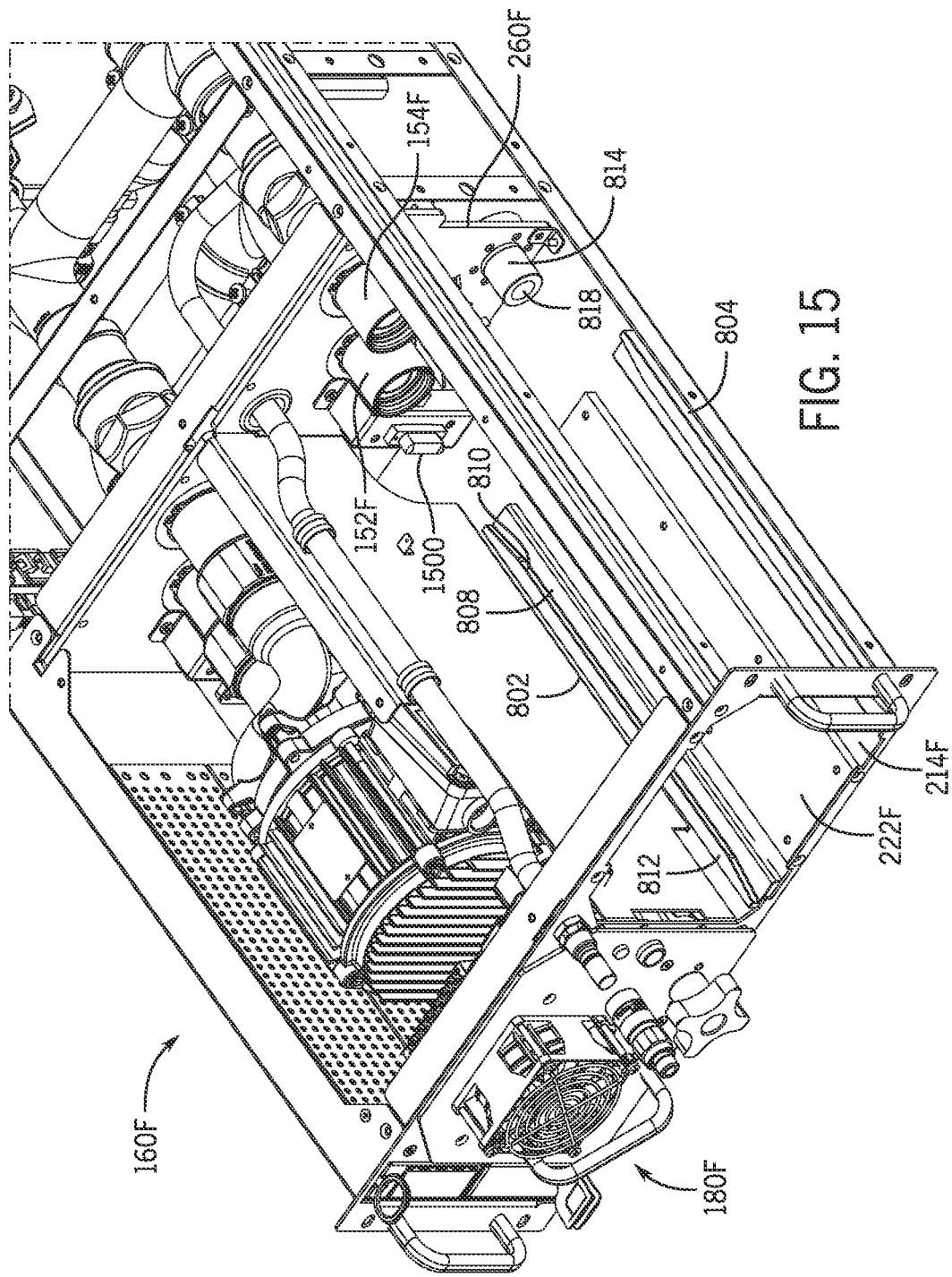
FIG. 15 is a partial isometric view of the RPU of FIG. 13, with panels removed and a pump cassette removed to show cassette support features of the RPU.
Figure 16:
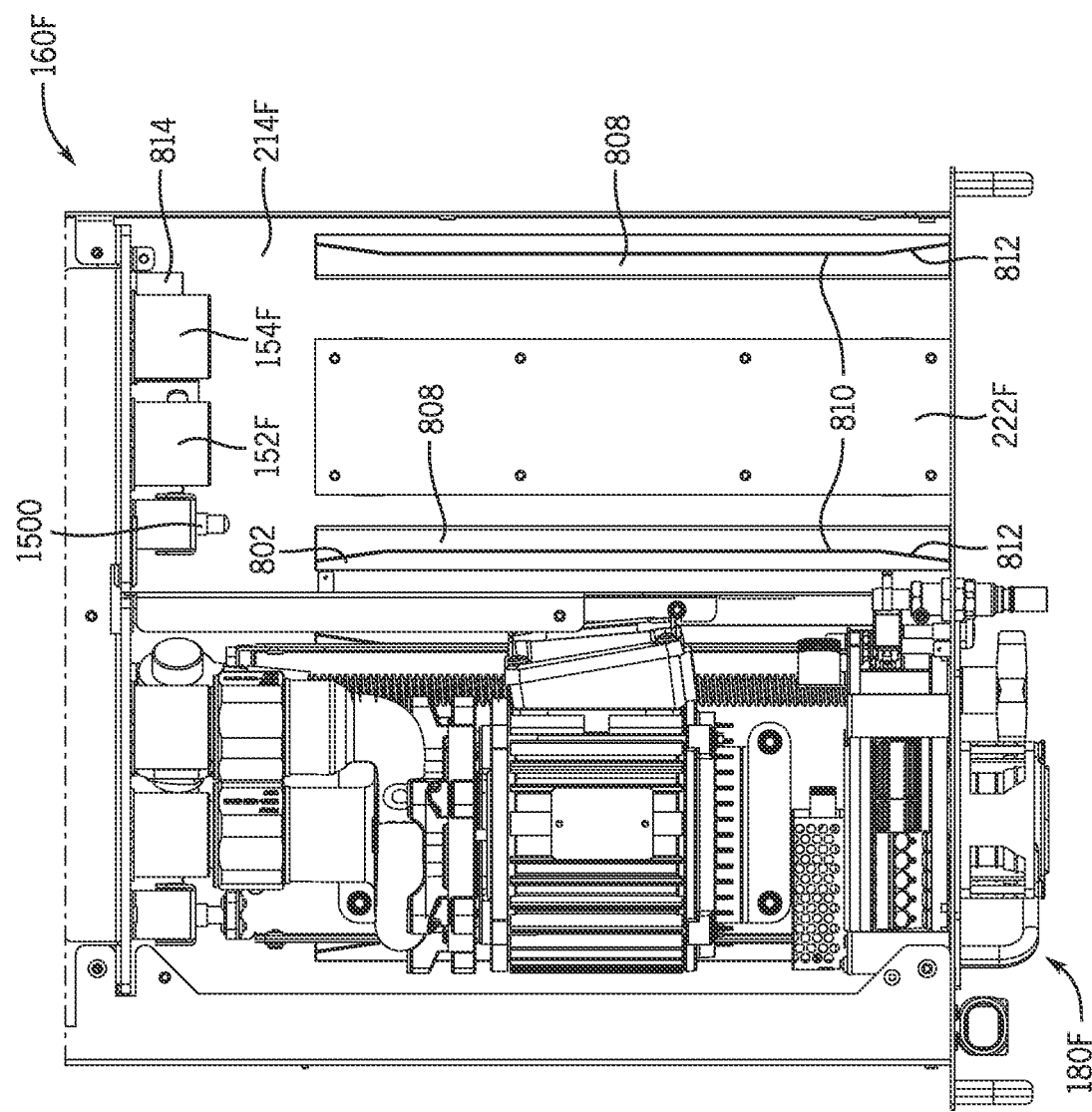
FIG. 16 is a partial top plan view of the RPU of FIG. 13, with panels removed and a pump cassette removed to show cassette support features of the RPU.
Figure 18:
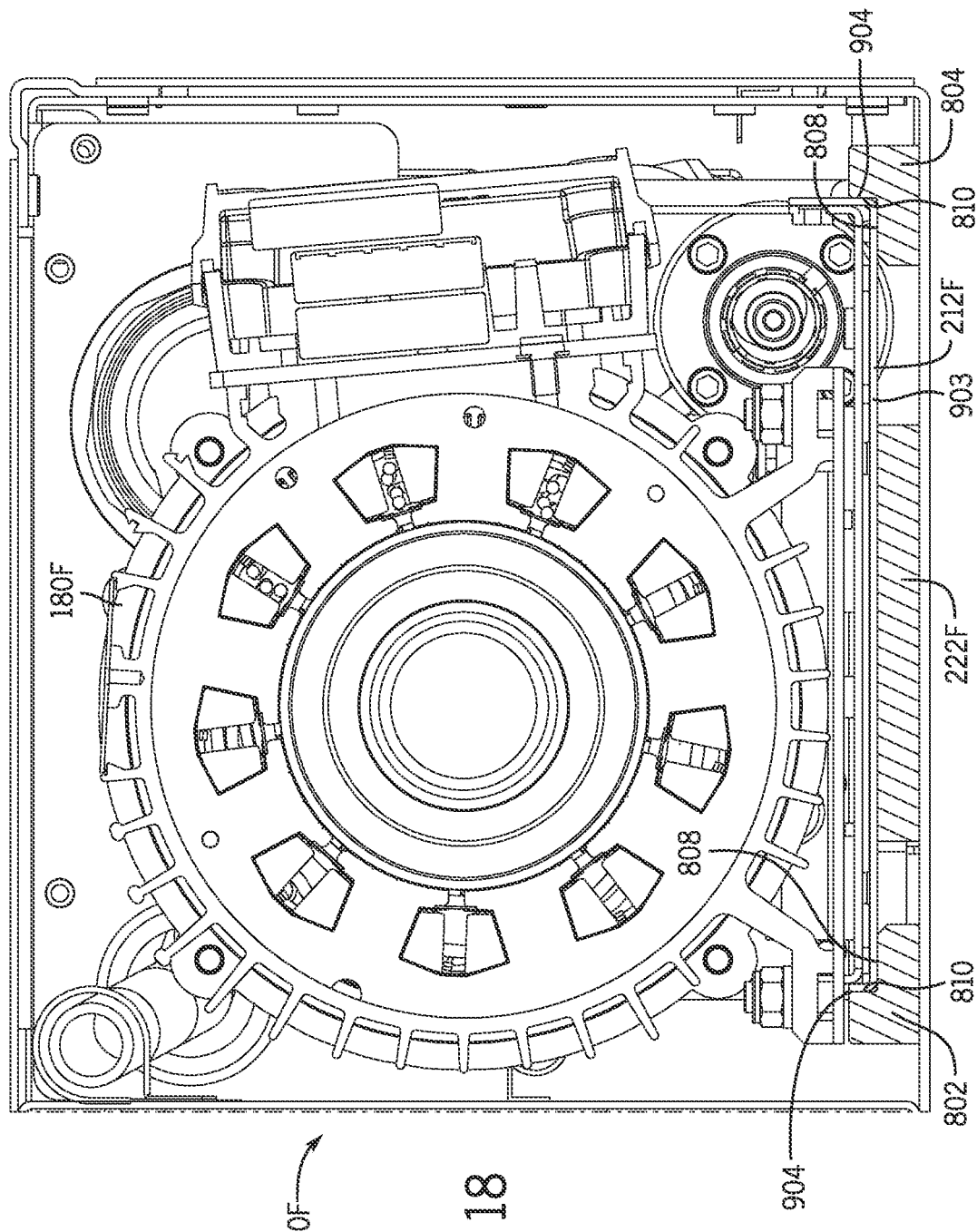
FIG. 18 is a partial cross-sectional view of the RPU of FIG. 13, showing an engagement of cassette support features of the RPU and of a pump cassette.

In this regard, FIGS. 15 and 16 illustrate cassette support features of the RPU 160F, showing the RPU 160F with one pump cassette 180F removed. As shown, the RPU 160F can include cassette support features which can be integrally formed with or fixed to a base plate 214F of the RPU 160F. The cassette support features can include a raised central member 222F, a first side bracket 802 and a second side bracket 804. The raised central member 222F can define a substantially flat horizontal surface, configured to engage a bottom surface of a pump cassette (e.g., the pump cassette 180F). The side brackets 802, 804 can be each be a mirror image of the other side bracket 802, 804 and can include features for lateral support of a pump cassette to be inserted into the RPU 160F. For example, the side brackets can define an "L" shape, with a first surface 808 (e.g., a horizontal surface) that is configured to engage a bottom surface of a pump cassette, and a second surface 810 (e.g., a vertical surface) that is substantially perpendicular to the first surface 808 and is configured to engage a lateral side of a sled base of the pump cassette 180F (e.g., as shown in FIG. 18). The substantially flat horizontal surface of the raised central member 222F can be co-planar with the first surface 808 of each of the first and second brackets 802, 804, as can allow a pump cassette inserted into the RPU 160F to rest on a substantially level surface. Gaps can be defined between the raised central member 222F and the side brackets 802, 804, as can allow airflow beneath a pump cassette 180F inserted into the RPU 160F, and also reduce a friction during insertion and removal. In some embodiments, side brackets and a raised central member can be included in a single integral support feature, and first surfaces of respective side brackets can be continuous with a substantially flat horizontal surface of the raised central member (e.g., with no gaps between the surfaces).

A relative positioning of side brackets of cassette support features for an RPU can ensure lateral positioning of a pump cassette inserted into an RPU and prevent lateral displacement of an installed pump cassette. For example, a distance between the second surface 810 of the first bracket 802 and a second surface 810 of the second bracket 804 can be substantially identical to a width of a sled base of a pump cassette 180F (e.g., sled base 212F as shown in FIG. 18 and described below). Thus, an engagement between the second surfaces 810 of the respective side brackets 802, 804 and lateral sides of a sled base of the pump cassette 180F can prevent displacement of an inserted pump cassette 180F. In some embodiments, as illustrated, angled guide features 812 of the second surface can be angled laterally outwardly (e.g., away from an opposing side bracket), so that a distance between the second surfaces 810 of the first and second brackets 802, 804 along the angled guide features 812 can be greater than a width of a base of the pump cassette 180F. The angled guide features 812 can be positioned proximate to an entry point of the pump cassette 180F and can guide insertion of the pump cassette 180F so that positioning of the pump cassette 180F is not required before insertion. In some embodiments, a second surface (e.g., a vertical surface) of side brackets of a cassette support system for a pump cassette in an RPU can be substantially planar along a length of the side bracket.

Figure 17:
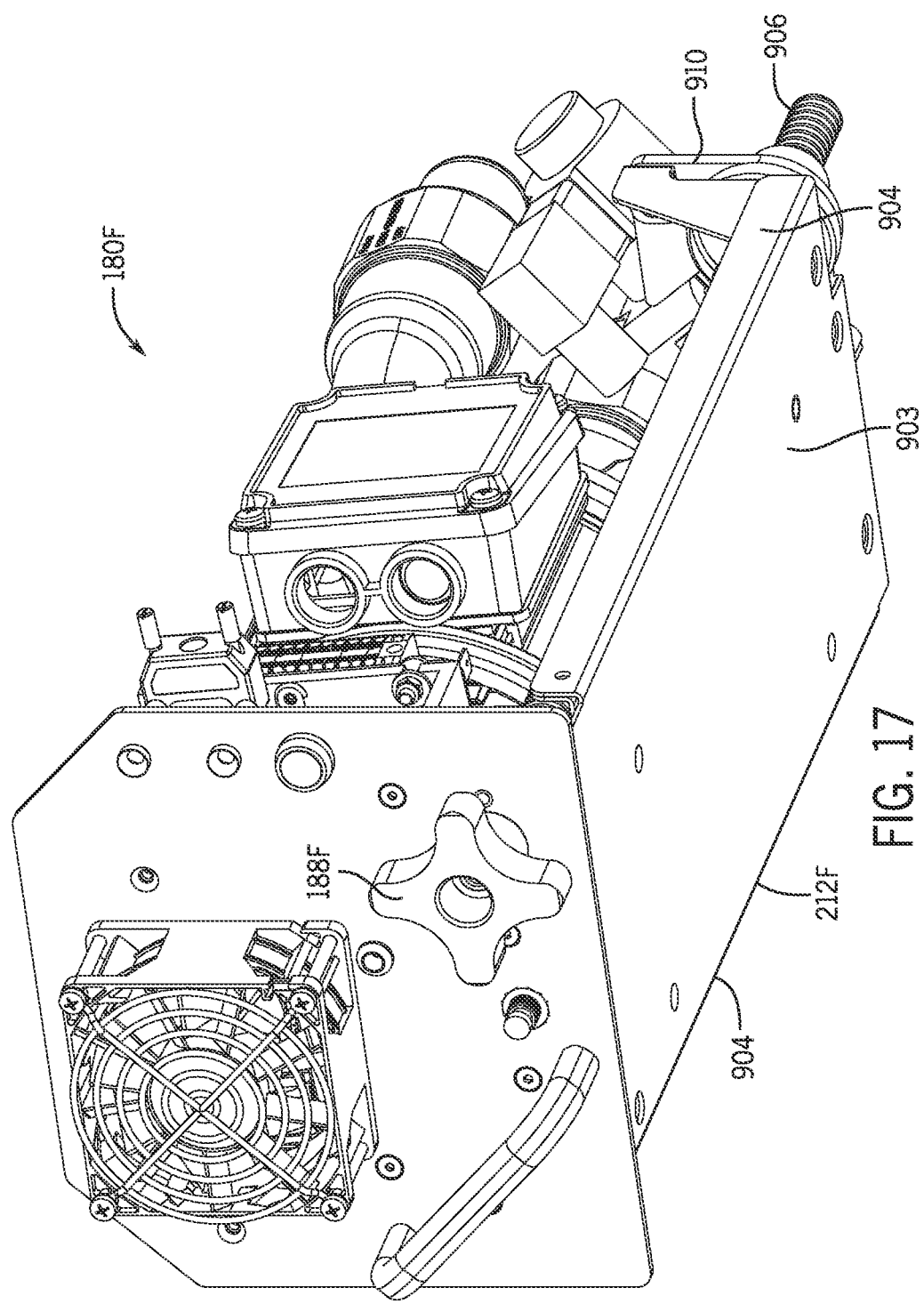
FIG. 17 is a bottom front right isometric view of a pump cassette of the RPU of FIG. 13, according to some embodiments.

In some cases, an RPU can further include features and systems for preventing a longitudinal displacement of a pump cassette within the RPU (e.g., a displacement of an installed pump cassette in a direction parallel to an insertion direction of the RPU). Systems for preventing longitudinal displacement of a pump cassette can be configured to provide a locked configuration and an unlocked configuration of a retention mechanism of the pump cassette and RPU, as described above. As illustrated a collar 814 can be provided for the RPU 160F and can be supported by and fixed to the bracket 260F. The collar 814 can include a threaded bore 818, which can be configured to receive a threaded rod of a pump cassette (e.g., threaded rod 906 of pump cassette 180F as shown in FIG. 17). An engagement between a threaded rod of a pump cassette and the collar 814 can tighten an engagement between connection modules of a pump cassette and an RPU (e.g., between respective connections 232F, 234F of the pump cassette 180F and connections 152F and 154F of the RPU 160F) and can prevent longitudinal displacement of the pump cassette within the RPU in a locked configuration.

Referring now to FIG. 17, the pump cassette 180F is shown, defining geometries and features configured to engage cassette support and retention features of an RPU (e.g., as described with respect to features of RPU 160F shown in FIGS. 15 and 16). For example, the pump cassette 180F includes a sled base 212F with a bottom surface 903 and opposing lateral surfaces 904 (e.g., vertical surfaces perpendicular to the bottom surface 903) which can be sized and configured to engage with surfaces of the raised central member 222F and side brackets 802, 804 (e.g., as shown in FIGS. 15 and 16).

The pump cassette 180F can include a threaded rod 906 that can be sized to be received into the threaded bore 818 of the collar 814 illustrated in FIGS. 15. The threaded rod can extend along a length of the pump cassette 180F and can be mechanically connected to the knob 188F extending from a front surface of the pump cassette. Rotation of the knob 188F can cause corresponding rotation of the threaded rod 906, as can allow an operator to secure the pump cassette 180F within an RPU from a front side of the RPU. In some embodiments, support members can be provided along a pump cassette to support a threaded rod and ensure positioning of the threaded rod with a corresponding collar of an RPU during insertion. For example, as further illustrated in FIG. 17, a support wall 910 can be provided in a back portion of the pump cassette, and the support wall can include an aperture (e.g., a bore in a collar of the pump cassette) for receiving the threaded rod 906. An aperture provided in a support wall can thus prevent or restrain a lateral and vertical displacement of a threaded rod relative to a pump cassette, which can allow positioning of the threaded rod with a collar of an RPU during installation of the pump cassette.

FIG. 18 is a cross-sectional view of a single of the RPU 160F with the pump cassette 180F installed therein. In particular, FIG. 18 illustrates an engagement between surfaces of the sled base 212F of the pump cassette 180F and cassette support features 222F, 802, 804 of the RPU 160F. As shown, when the pump cassette 180F is installed in the RPU 160F, the bottom surface 903 is in contact with the horizontal surface of the central raised member 222F, and the first surfaces 808 of the first and second bs 802, 804. Further, the opposing lateral surfaces 904 are engaged with respective second surfaces 810 of the side brackets 802, 804. In some embodiments, lateral surfaces of a base of a pump cassette are not in contact with first sides of side brackets, and a minimal gap can be provided between the lateral surfaces and corresponding first surfaces to reduce a friction during installation, allow for a margin of error in a width of the base, allow for thermal expansion of components of the pump cassette and RPU, etc. Thus, the cassette support features of the RPU 160F (e.g., the central raised member 222F, and side brackets 802, 804) can limit or prevent a displacement in a vertical direction (e.g., in conjunction with gravity) and a lateral direction.

Figure 19:
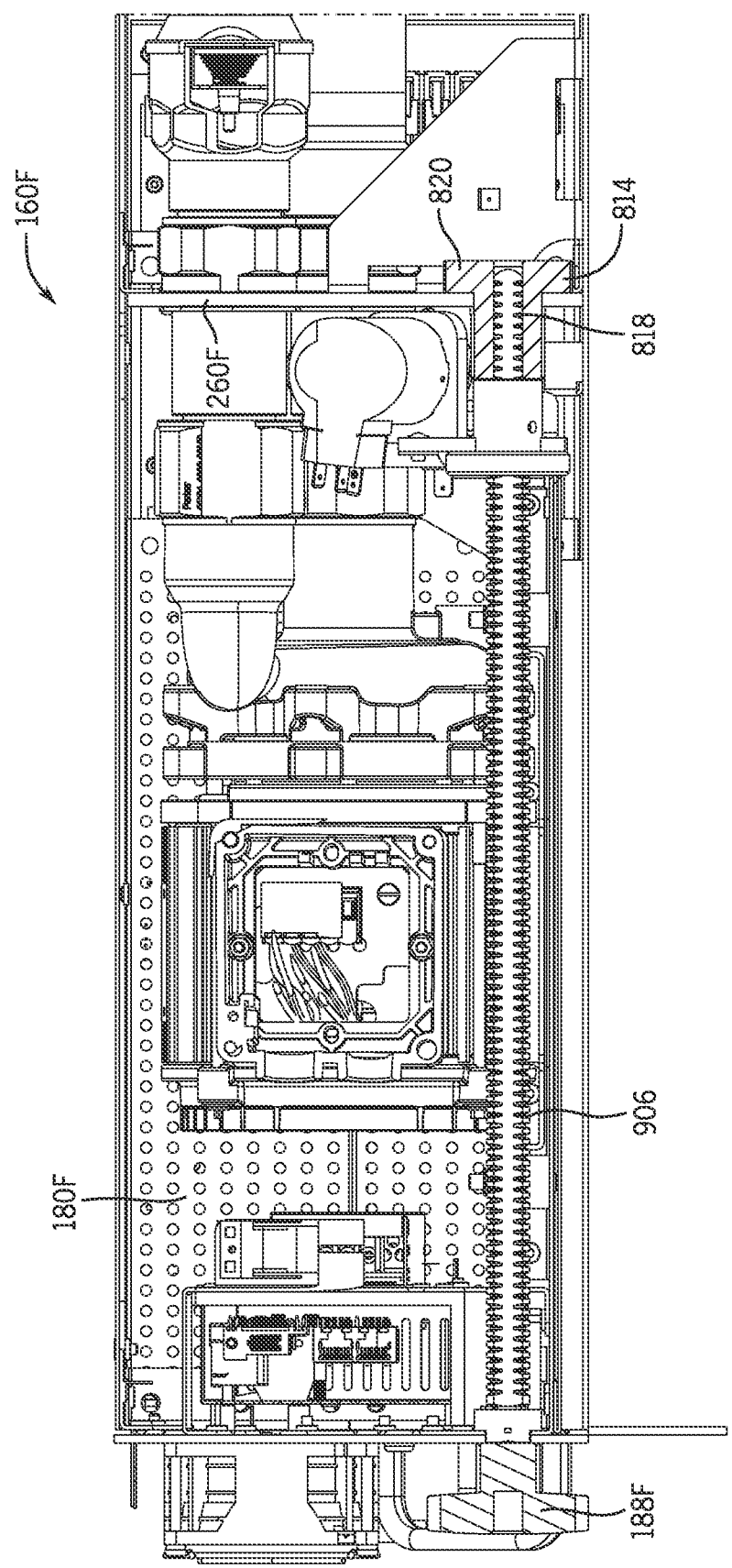
FIG. 19 is a partial cross-sectional view of the RPU of FIG. 13, showing a mechanical retention mechanism of the RPU.

As noted above, an RPU and/or pump cassette can further include mechanisms to prevent or limit displacement in a longitudinal direction (e.g., a direction parallel to an insertion direction), and secure the pump cassette in place relative to the RPU. For example, FIG. 19 is a cross-sectional view of the RPU 160F, illustrates an engagement between the threaded rod 906 of the pump cassette 180F (e.g., as illustrated in FIG. 17) and the collar 814 of the RPU (e.g., as illustrated in FIG. 15). The collar 814, as shown, can include a peripheral flange 820 which can engage the bracket 260F to oppose displacement of the collar 814 in a direction opposite the insertion direction of the pump cassette 180F. As shown, the threaded rod 906 extends along a length of the pump cassette 180F and extends rearwardly from the pump cassette 180F. In the installed configuration, as shown, the threaded rod 906 is at least partially received into the collar 814 and is coaxial with the threaded bore 818. Thus, a rotation of the knob 188F in a first direction (e.g., clockwise) can secure the threaded rod 906 within the collar 814 and tighten an engagement between the pump cassette 180F and the RPU 160F (e.g., can displace the pump cassette 180F in the insertion direction to bring elements such as quick connect fittings into tighter engagement). A rotation of the knob 188F in the opposite direction (e.g., counter-clockwise) can displace the pump cassette 180F in a direction opposite the insertion direction and can ultimately disengage the threaded rod 906 from the collar 814, allowing removal of the pump cassette 180F from the RPU 160F. In some embodiments, a threaded rod can be threaded along an entire length of the rod (e.g., as illustrated). In some embodiments, a threaded rod can be threaded only at a distal end to engage a collar of the RPU. In other embodiments, and rod for securing a pump cassette within an RPU can include a cam structure which can be rotated to overhang a surface of the RPU and restrict longitudinal displacement of the pump cassette. In some embodiments, any know mechanisms for securing a fastening element of a rod to a structure in response to a rotational movement can be used to secure a pump cassette within an RPU.

Figure 20:
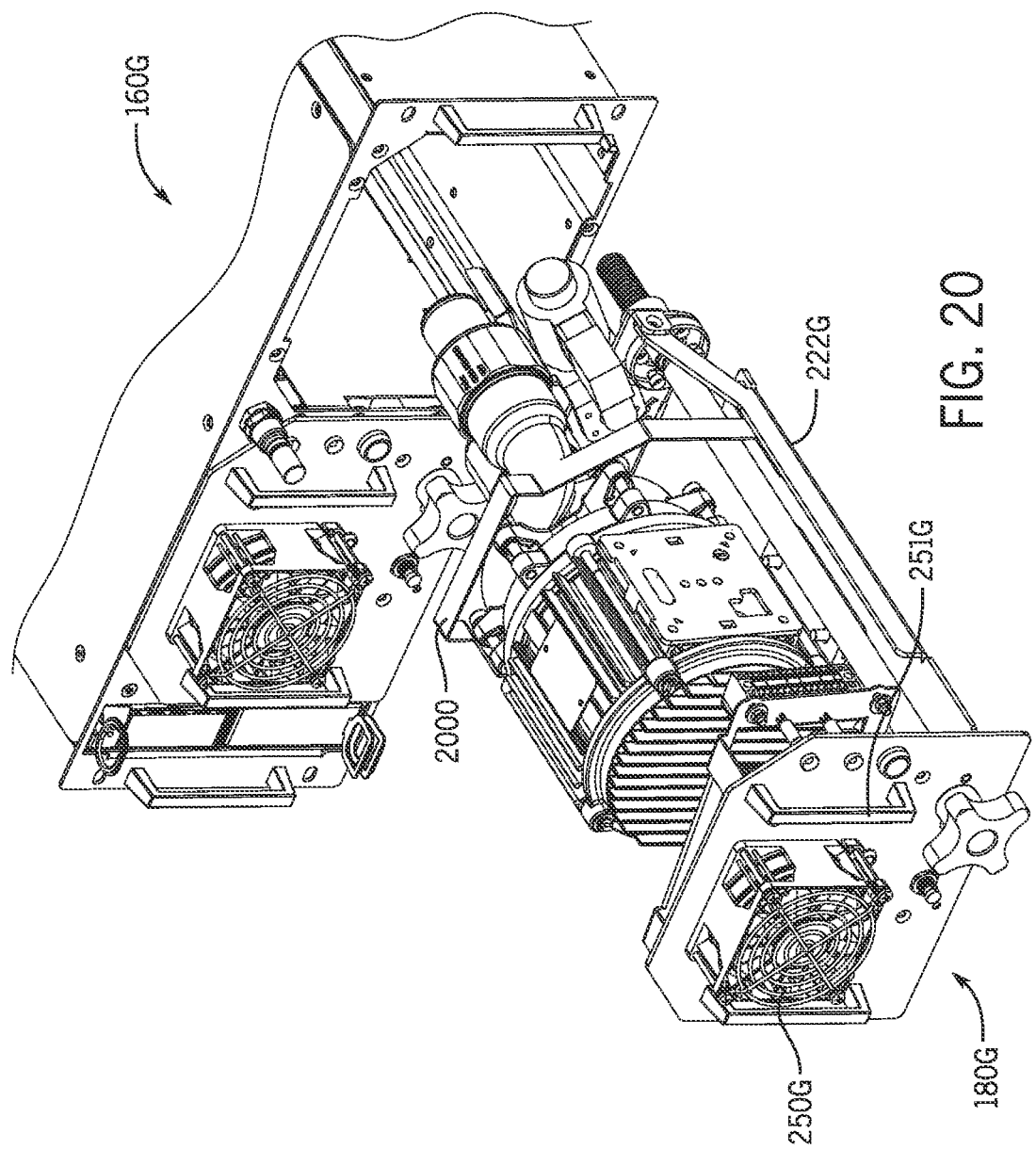
FIG. 20 is a partial isometric view of an RPU with a pump cassette shown exploded from the RPU to illustrate features of the pump cassette.

In some embodiments, pump cassettes can include additional features to provide grip points for an operator, and ease an installation, removal, and transportation of the pump cassette. For example, a pump cassette may have considerable weight, and providing two handles for the cassette at a front of the cassette can allow an operator to grip the cassette with two hands, which can improve a control of the operator when inserting or removing a pump cassette. In this regard, FIG. 20 illustrates an RPU 160G, which can be an example of the RPU 160 described in FIGS. 1 and 2. As shown, the RPU 160G can include a pump cassette 180G, with a first handle 250G and a second handle 251G provided on a front face of the pump cassette 180G. In the illustrated embodiment, the handles 250G, 251G are spaced apart on opposite lateral sides of the pump cassette, and are oriented vertically (e.g., the handles are parallel and extend upwardly from the perspective shown). In other embodiments, handles of a pump cassette can be positioned on opposite vertical sides (e.g., at a top and bottom) of a front face of a pump cassette, and can be oriented horizontally (e.g., the handles can at least partially span a lateral width of the pump cassette). In some embodiments, handles of a pump cassette can be positioned at an oblique angle relative to a vertical direction, and can be positioned to increase a comfort of an operator when using the handles to insert or remove the pump cassette.

In some cases, pump cassettes can further include carrying handles to facilitate transportation of the pump cassette (e.g., carrying the pump cassette when the pump cassette is not aligned with an opening in an RPU). In this regard, FIG. 20 illustrates a rear handle 2000 for the pump cassette 180G. The rear handle 2000 can span a width of the pump cassette 180G and can be secured to the pump cassette 180G at opposing lateral sides of a sled base 222G of the pump cassette 180G. In some embodiments, a rear handle of a pump cassette can include features for enhancing a comfort of a user when the user is transporting the pump cassette. For example, a rear handle can include a rubber, a foam, or gripping grooves at a gripping surface of the handle. In some embodiments, the rear handle can be positioned longitudinally along the pump cassette to provide a balancing of a weight of the pump cassette about the rear handle when a user is carrying the pump cassette by the rear handle.

Figure 21:
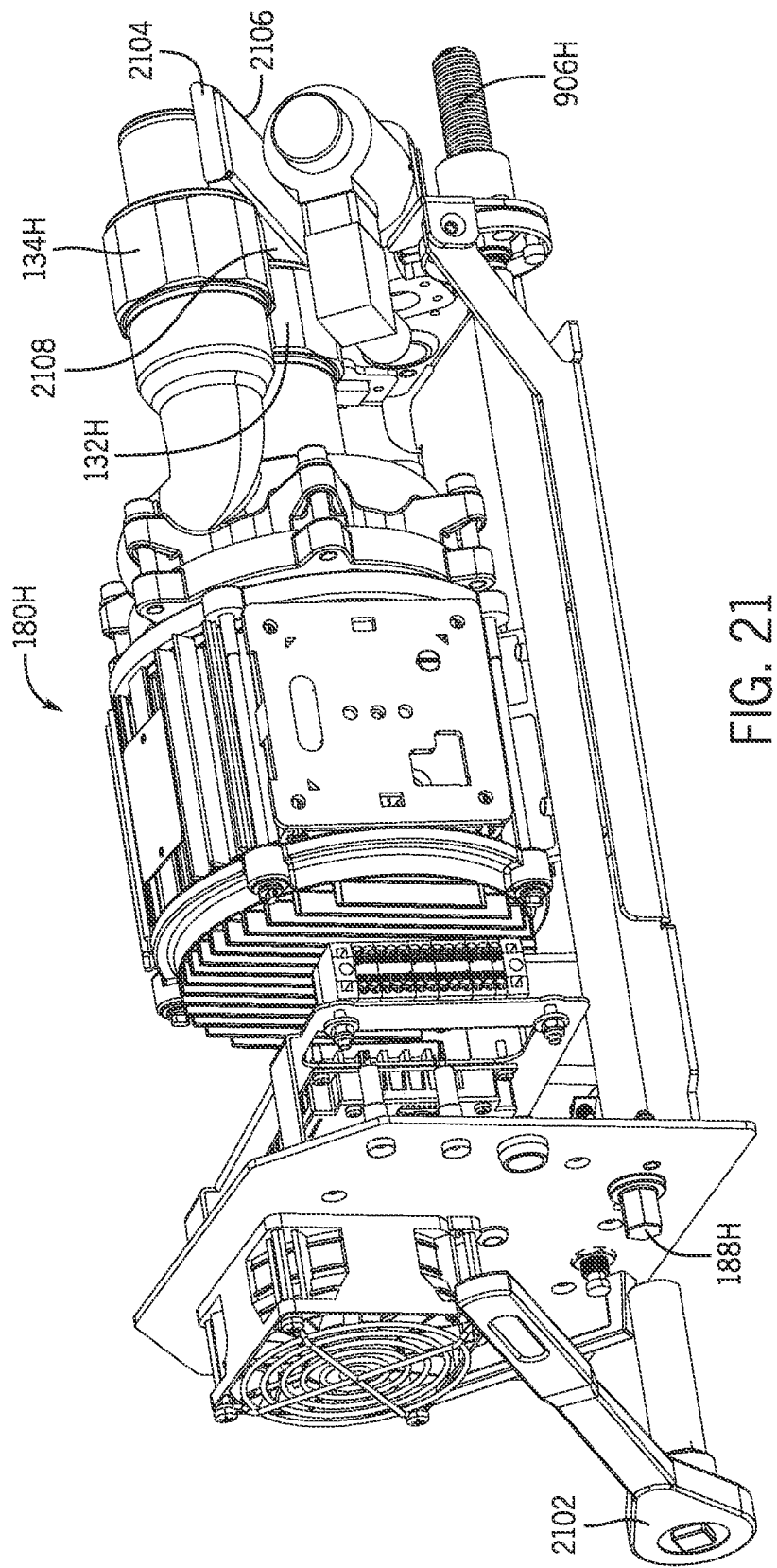
FIG. 21 is an isometric view of a pump cassette of an RPU, according to some embodiments.

In some cases, retention mechanisms of a pump cassette can be automated, and can be electrically driven. For example, in some embodiment, including as shown in FIG. 21, a pump cassette does not include a knob for rotating a threaded rod 906H of the pump cassette 180H. For example, the threaded rod 906H can be operatively connected to a motor (not shown), such as a servo motor, for example, and the motor can rotate the threaded rod 906H to engage or disengage a corresponding retention feature of an RPU (e.g., the collar 814 of the RPU 160F, shown in FIGS. 15, 16, and 19). A pump cassette including an automated retention mechanism may still allow for manual installation and engagement of the retention mechanism to place the pump cassette in a locked or unlocked configuration relative to an RPU. In this regard, FIG. 21 illustrates a hexagonal protrusion 188H protruding from a front face of the pump cassette 180H. The hexagonal protrusion 188H may allow the use of tools, such as the illustrated socket wrench 2102 to rotate the threaded rod 906H in order to install or disengage the pump cassette 180H from an RPU. In some embodiments, the hexagonal protrusion can be sized to fit a standard socket head of a socket wrench (e.g., the socket wrench 2102). For example, the hexagonal protrusion can be sized to be received into a ¼ inch socket head, a ⅜ inch socket head, a ½ inch socket head, a ¾ inch socket head, a 1 inch socket head, or may have any other size (e.g., a cross-sectional profile) that may be received into a socket head having a standard size. In some cases, a removable knob can be provided to engage the hexagonal protrusion 188H to rotate the threaded rod 906H to either install or disengage the pump cassette 180H from an RPU.

In some cases, when a pump cassette is installed or removed from an RPU, the engagement and disengagement of connections (e.g., inlet connections and outlet connections of the RPU and the pump cassette) can produce leakage of fluid at an interface between the connections. Thus, drip pans can be provided at interfaces between connections to capture leaked fluid in order to prevent a leakage of the fluid onto other portions of the RPU or cooling system. For example, FIG. 21 further illustrates a drip pan 2104. The drip pan 2104 is positioned vertically beneath connections 132H, 134H of the pump cassette 180H, to receive fluid that may leak from the respective connections during an installation or removal of the pump cassette 180H into an RPU. The drip pan has a first wing 2106 on a first side of the connections 132H 134H, and a second wing (not shown) on an opposite lateral side of the connections 132H, 134H. The first wing 2106 and second wing can comprise a "V" shape, with distal ends of each wing being elevated relative to a central joining point (e.g., a vertex of the V shape of the drip pan 2104, not shown). The drip pan can define retention sidewalls 2108 along a perimeter of the drip pan defining a valley between sidewalls 2108, to prevent flow of fluid out of the drip pan 2104. In some embodiments, a pump cassette does not include a drip pan.

Figure 22B:
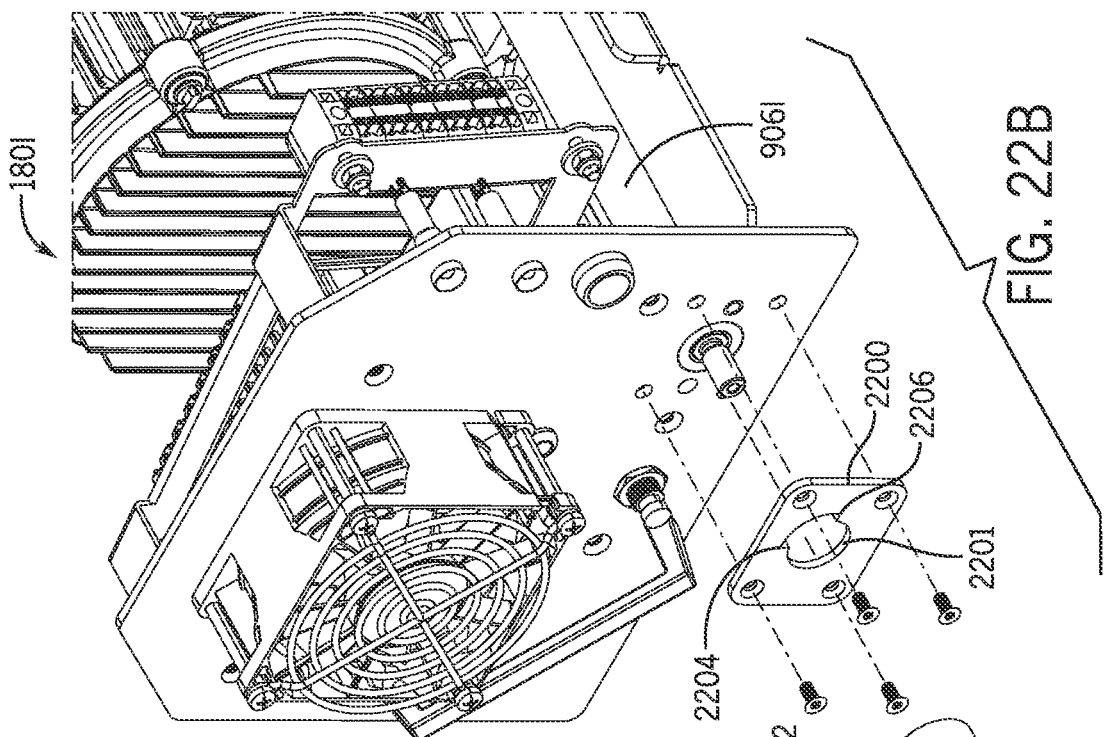
FIGS. 22A and 22B are partial isometric views of a pump cassette for an RPU, according to some aspects.
Figure 22A:
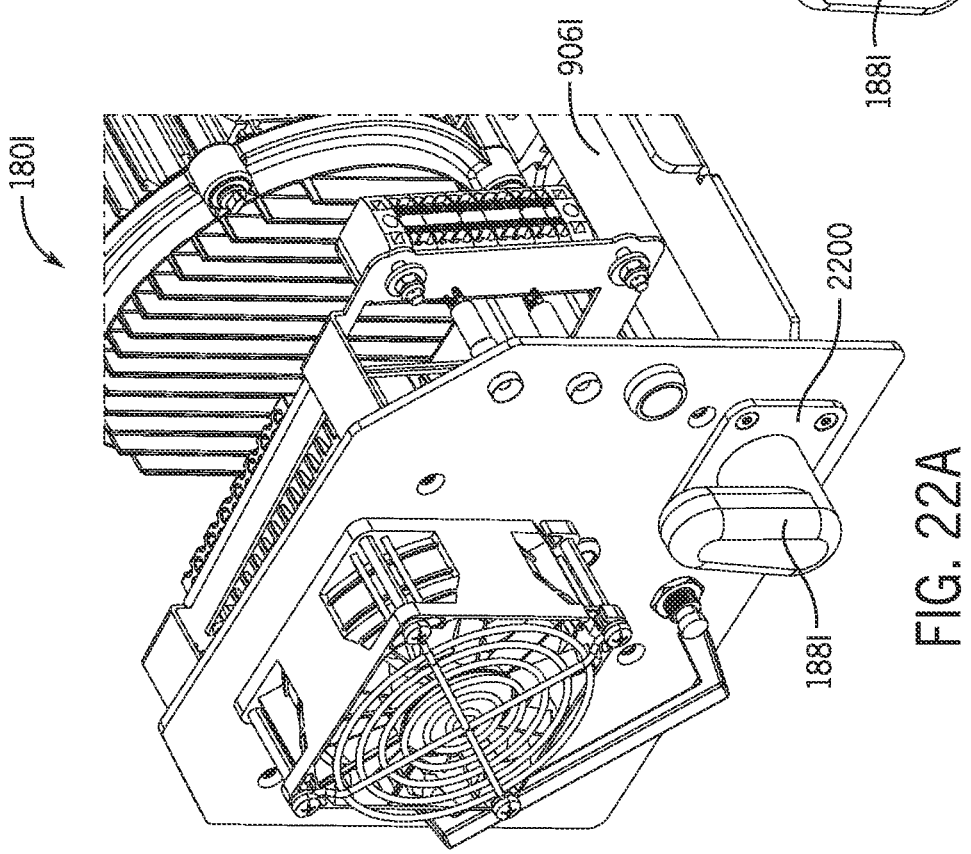

FIGS. 22A and 22B illustrate another retention mechanism for a pump cassette 180I, as an example of pump cassette 180 described in FIGS. 1 and 2. As shown, a ratcheting handle 188I can be provided along a front face of the pump cassette. The ratcheting handle 188I can be mechanically coupled to a shaft 9061, which can include a threaded portion at a distal end (not shown) to be received into a collar of an RPU (e.g., collar 814 of RPU 160F) to secure the pump cassette 180I to the RPU. As shown, the ratcheting handle 188I is installed over a plate 2200. As illustrated in FIG. 22B, the plate 2200 can define an aperture 2201 to at least partially receive the ratcheting handle 188I. The aperture 2201 can include a ratchet section defined between a first stopping surface 2204 and a second stopping surface 2206. The ratcheting handle 188I can include a protruding member 2202 that is sized to be received into a radial area of the aperture 2201 between the stopping surfaces 2204, 2206. Rotation of the ratcheting handle relative to the plate 2200 can thus be constrained by an engagement between the protruding member 2202 and the respective stopping surfaces 2204, 2206. In some embodiments, the stopping surfaces 2204, 2206 can be angularly spaced from each other by about 90 degrees, as can allow a 90 degree rotation of the ratcheting handle 188I relative to the plate 2200. In some embodiments, an angular space between stopping surfaces of a plate constraining angular rotation of a ratcheting handle can be more than 90 degrees, or less than 90 degrees. In some embodiments, a ratcheting handle is not rotationally constrained (e.g., a pump cassette does not include a plate with stopping surfaces). In some cases, when the ratcheting handle 188I is turned in a first direction (e.g., clockwise), the ratcheting handle 188I engages the shaft 9061 to produce a corresponding rotation of the shaft 9061, and when the ratcheting handle is turned in a direction opposite the first direction (e.g., counterclockwise), the ratcheting handle does not engage the shaft 9061, and thus, does not produce a corresponding rotation of the shaft 9061.

Figure 23:
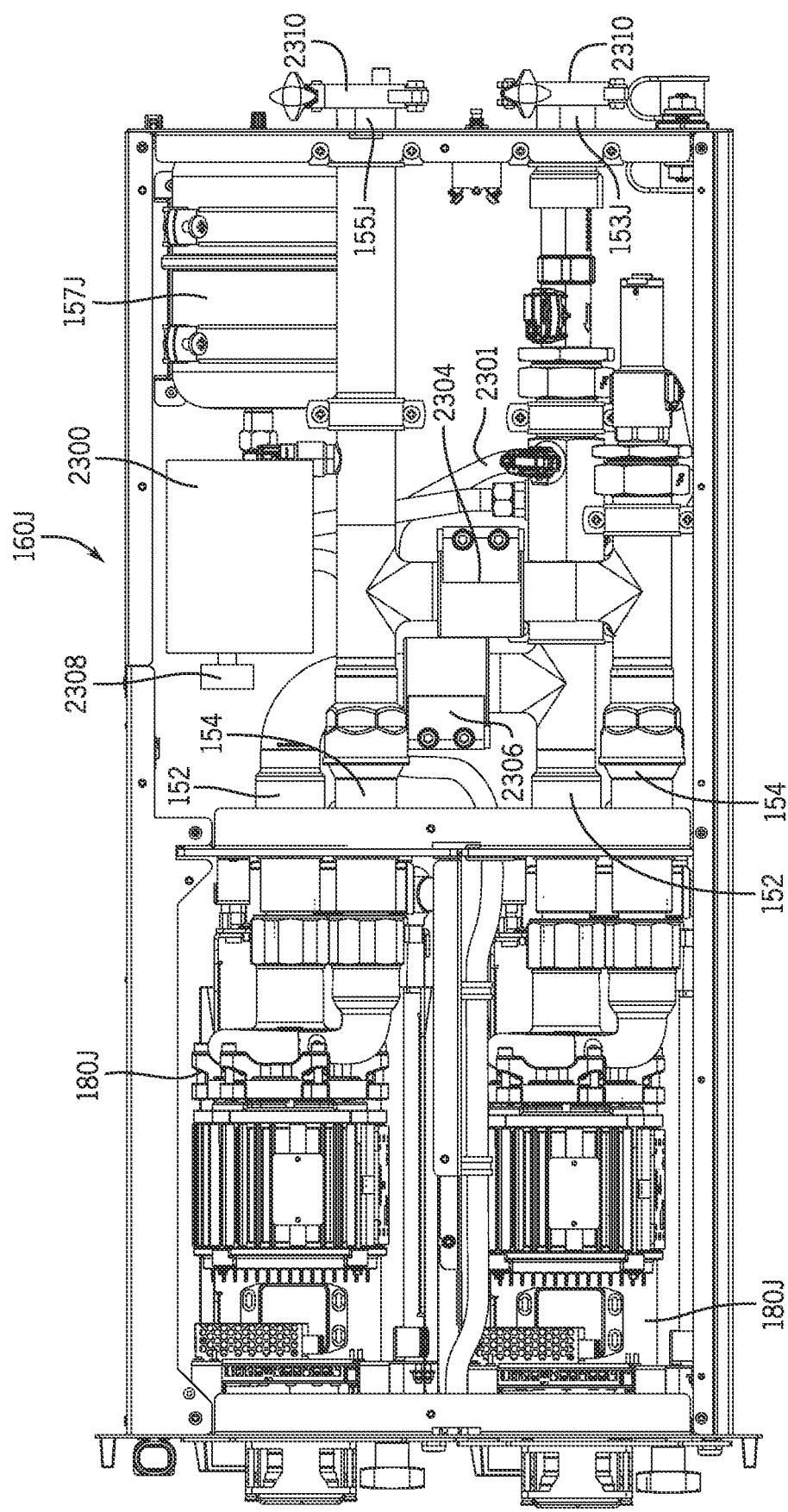
FIG. 23 is a top plan view of an RPU, with panels of the RPU removed to illustrate internal components.

In some cases, an RPU can receive a heated fluid from electrical components being cooled by a cooling system (e.g., cooling system 100 described with respect to FIGS. 1 and 2). Heated fluid can expand and increase a pressure in plumbing elements of a cooling system, including an ICD and an RPU (e.g., ICD 120 and RPU 160 shown in FIGS. 1 and 2). Thus, in some cases, an increased heat load of electrical components to be cooled can cause a corresponding increase in pressure in an RPU. When a heat of the fluid in the RPU exceeds a boiling point, fluid (e.g., water) can boil and escape the liquid cooling circuit. Leakage of fluid through the circuit can negatively decrease an overall pressure and reduce a cooling efficiency of the cooling system. In some cases, then, systems can be provided for an RPU to regulate a pressure within fluid lines of the RPU, and mitigate a fluid loss within the RPU (e.g., due to boiling or leakage of fluid). In this regard, FIG. 23 illustrates an RPU 160J, which is an example of the RPU 160 illustrated in FIGS. 1 and 2.

In some embodiments, for example, an RPU can include an internal expansion tank, which can accommodate for thermal expansion and other volume fluctuations. An internal expansion tank can be charged to maintain a fluid beneath a threshold pressure (e.g., 1 bar), and when a pressure along a fluid line exceed that value, the expansion tank can relieve a pressure along a fluid line by receiving a portion of the fluid (e.g., in the case of thermal expansion) until a pressure of a fluid line falls below the threshold pressure. It can thus be advantageous to position an expansion tank along an inlet of an RPU, upstream of pumping components, as can provide protection for pumping components against a wear caused by a thermal expansion of a fluid and a resulting pressure increase. In this regard, FIG. 23 illustrates an expansion tank 157J within the RPU 160J. As shown, the expansion tank 157J is fluidly connected to piping of the RPU 160J, at a point that is downstream of a RPU inlet 153J, and upstream of inlets 152 to pump cassettes 180J. So positioned, the expansion tank 157J can absorb an increased pressure of a heated fluid flowing into the RPU 160J at RPU inlet 153J so that a pressure along piping components of the RPU 160J is maintained below a threshold pressure. In some embodiments, an expansion tank can implement a threshold pressure of about 1 bar, about 1.1 bar, about 1.2 bar, about 1.3 bar, about 1.4 bar, or about 1.5 bar.

In some cases, systems can be provided for an RPU to at least partially regulate a pressure within piping components of the RPU by replacing fluid that is lost along a fluid coolant circuit. For example, a fluid of a liquid cooling circuit can leak when components along the liquid cooling circuit are removed or replaced. In some cases, when a quick connect connection is either connected or disconnected, this can result in a fluid loss. In some cases, fluid can be lost when a temperature of fluid within a liquid cooling circuit exceeds a boiling temperature, and fluid boils out of the piping of the liquid cooling circuit. In some cases, liquid cooling components (e.g., an RPU) can include fluid reservoirs to replace fluid loss within a system. The reservoir can be connected to piping of the liquid cooling components, and when a pressure decreases within the piping of the liquid cooling components, fluid from the reservoir can flow into the piping until a pressure of the system is restored, or until a pressure of fluid in the reservoir is approximately equal to a pressure of fluid in piping of liquid cooling components. In this regard, FIG. 23 illustrates a fluid reservoir 2300 within the RPU 160J. The fluid reservoir 2300 can be fluidly connected to a portion of the piping of the RPU 160J between the RPU inlet 153J and the inlet 152 of the pump cassettes 180J (e.g., via hose 2301). When a pressure of fluid within the piping drops below a minimum pressure, this can produce a suction along the hose 2301, drawing fluid from the reservoir into the piping of the RPU 160J. Fluid can flow from the reservoir 2300 to the piping of the RPU 160J until a minimum pressure has been reached for the system. In some cases, a reservoir can be fluidly connected to piping of an RPU at a different point. For example, a reservoir can be fluidly connected to piping between an outlet of the pump cassettes 154J and an RPU outlet 155J. Other configurations are possible, and pressure regulation elements (e.g., expansion tank 157J, reservoir 2300) can be fluidly positioned at any point along a flow path of a liquid cooling circuit. In some embodiments, an RPU does not include either of an expansion tank or a reservoir or includes only one of the expansion tank and the reservoir.

In some embodiments, an RPU can include a pressure regulating cap to relieve a pressure of fluid in the system when the fluid is boiling. For example, when a pressure exceeds a maximum value, a pressure cap can automatically open to relieve a pressure along a fluid coolant circuit (e.g., by allowing a steam or heated water to exit piping of the circuit through the pressure cap). In this regard, the RPU 160J can include a pressure cap 2308. The pressure cap 2308 can automatically open to relieve a pressure when a fluid within the RPU 160J (e.g., a fluid of the reservoir 2300) boils. In some cases, the pressure cap 2308 can be adjustable, and can be set to relieve a pressure when a pressure exceeds a value set by the user. In some embodiments, a pressure cap can be located at any point along piping of an RPU. In some embodiments, an RPU can include multiple pressure caps, including to mitigate overpressure when a pressure differential exists across components of an RPU.

In some cases, piping of an RPU can include flexible hosing sections. For example, piping elements of a RPU can experience loads which can result in a temporary or permanent deformation of a respective component. In some cases, insertion of a pump cassette into the RPU can produce a temporary load on piping connected to connectors (e.g., connectors 152, 154) of the RPU. In some cases, pipes can expand when a temperature of a fluid flowing through the pipes increases and can contract when a temperature of a fluid flowing through the pipes. In some examples, all piping in an RPU can be rigid, a deformation or load on one portion of the piping can result in a corresponding deformation along the entire piping of an RPU. A cumulative deformation and load from loads on different portions of a rigid piping assembly of an RPU can produce a wear across piping elements of the system, as can degrade a lifespan of the RPU and components thereof. The RPU 160J can include features for preventing the above-described issue, and flexible hosing 2304, 2306 can be provided at points along a piping of the RPU 160J to prevent transfer of a force or load on one component to produce a corresponding force or deformation across all piping of the RPU 260J. The flexible hosing 2304, 2306 can absorb a force, and can deform to accommodate the force, thus reducing a load on the remainder of the piping. In the illustrated embodiment, the flexible hosing 2304, 2306 extends laterally, thus partially mechanically decoupling piping elements on a first lateral side of the RPU 160J and piping elements on a lateral side of the RPU 160J opposite the first lateral side. In the illustrated embodiment, the flexible hosing 2304 is provided between parallel piping elements of fluid inlet (e.g., between fluid inlets 154) and the flexible hosing 2306 is provided between parallel piping elements of a fluid outlet (e.g., between fluid outlets 152). In other embodiments, flexible hosing can be provided at different points along piping of an RPU. In some examples, flexible piping can be provided along a longitudinal piping of the RPU 160J (e.g., flexible hosing can extend between a front and a rear of the RPU 160J, rather than laterally). In some embodiments, all piping of an RPU can comprise a flexible hosing.

Figure 24A:
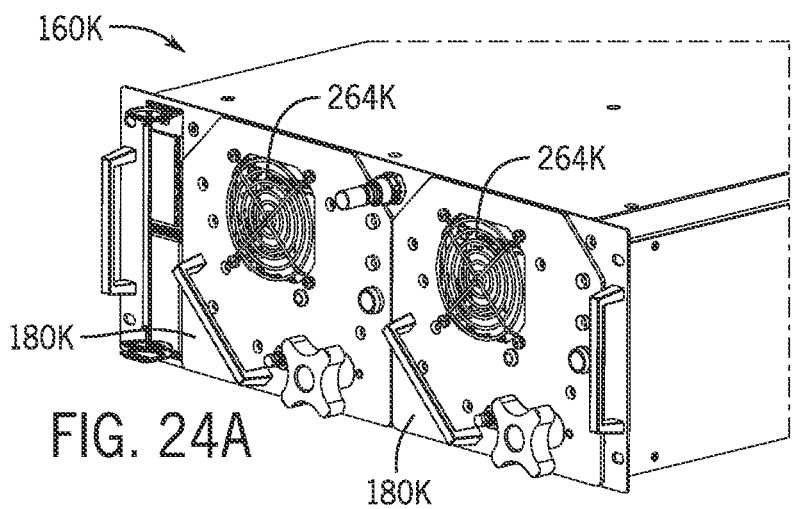
FIGS. 24A-24C illustrate aspects of an air flow arrangement for an RPU, according to some embodiments.
Figure 24B:
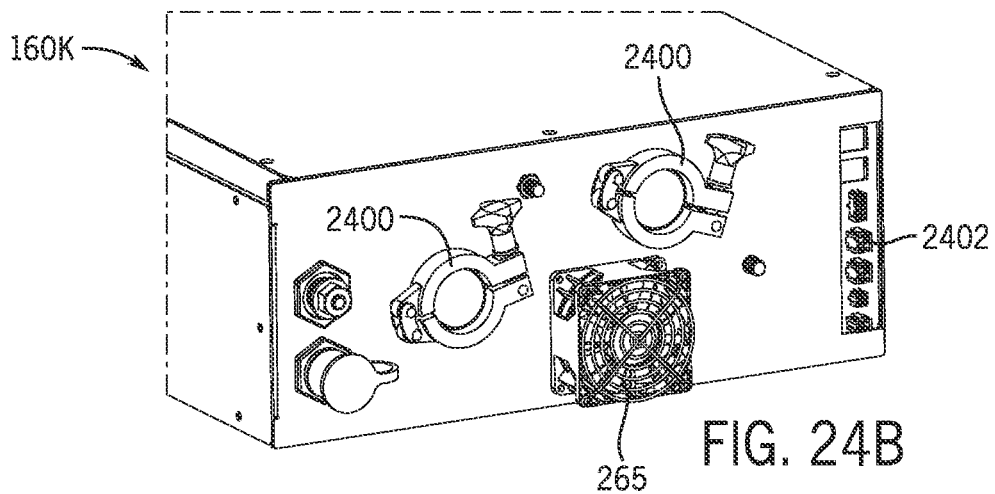
Figure 24C:
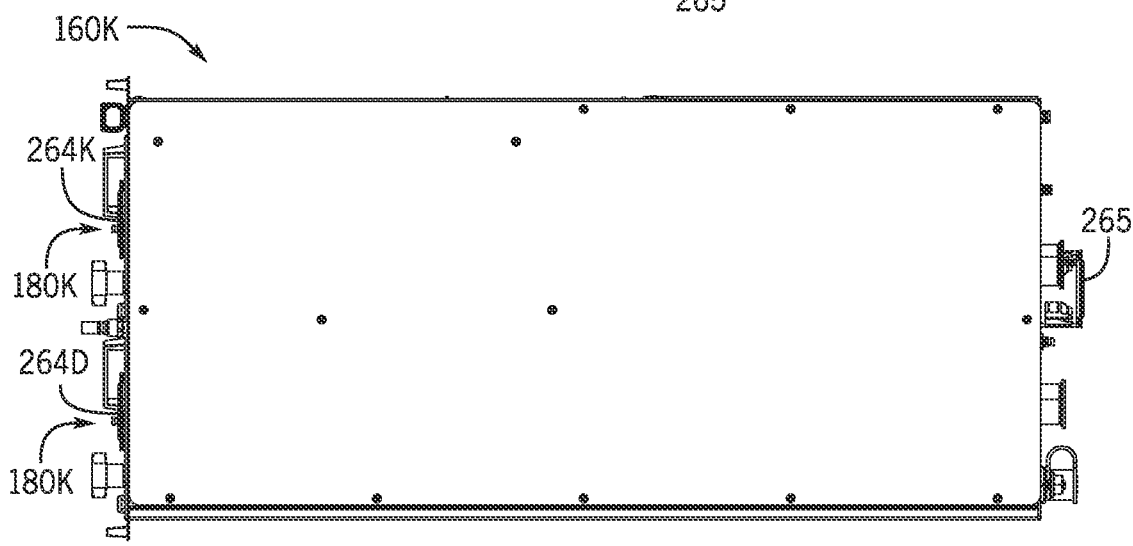

An RPU can include air flow components to cool elements of the RPU by inducing a flow of air across the RPU. For example, as shown in FIG. 24A, a RPU 160K can include fans 264K on respective pump cassettes 180K of the RPU 160K (e.g., similar, or identical to fans 264F of RPU 160F shown in FIG. 13). In some embodiments, the fans 264K can produce a flow of air in a direction parallel to an insertion direction of the pump cassettes 180K into the RPU 160K (e.g., from a front of the RPU 160K towards a back of the RPU 160K. In some embodiments, fans 264K can operate to pull air across components of the RPU 160K in a direction opposite the insertion direction of the pump cassettes 180K. Increasing an air flow across the RPU can increase a cooling of components of the RPU, which can extend a lifetime of system components. In some embodiments, additional fans can be provided along an RPU to increase an air flow through the RPU. As shown in FIG. 24B, a rear of the RPU 160K (e.g., a portion of the RPU 160K proximate to a hot aisle when the RPU is installed in a cabinet) can include a rear fan 265. The rear fan 265 can operate to increase an air flow through the RPU 160K, in conjunction with the fans 264K of the pump cassettes 180K. For example, when the pump cassette fans 264K are operating to blow air in an insertion direction of the pump cassette 180K, the rear fan 265 can operate to pull air across the RPU 160K in the same direction of air flow (i.e., in the insertion direction of pump cassette 180K). In some cases, the rear fan 265 is activated when a heat in the RPU 160K exceeds a threshold heat. In some cases, a user can manually activate or deactivate the fan 265 (e.g., through an interface of a controller of the RPU). In some embodiments, an RPU can include two rear fans in a back of the RPU. In some cases, one or more rear fans can be used instead of fans of pump cassettes of the RPU.

Figure 26:
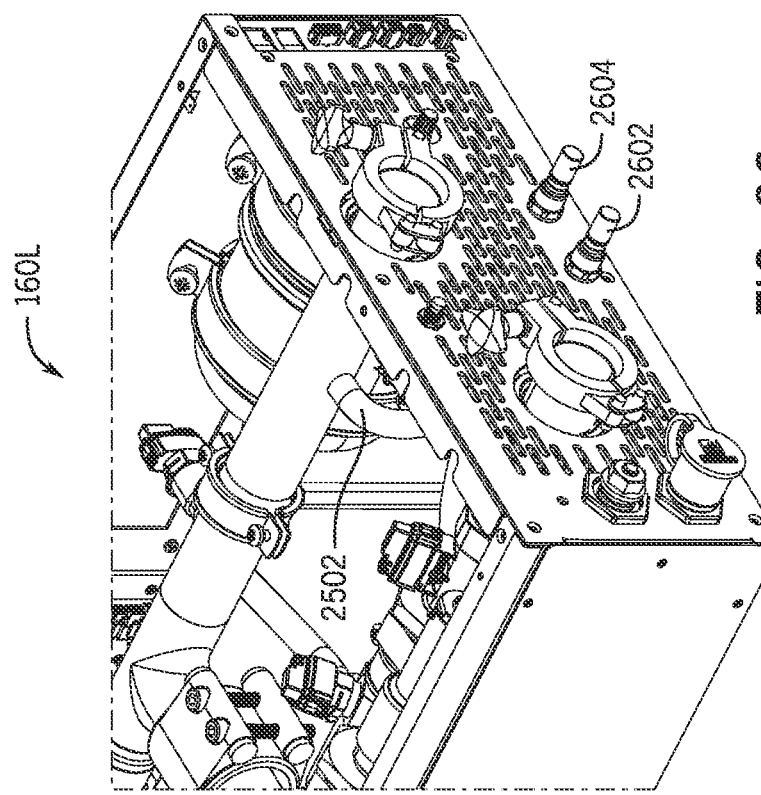
FIGS. 25 and 26 are partial isometric views of an RPU, illustrating an arrangement of a fill/drain line, according to some embodiments.
Figure 25:
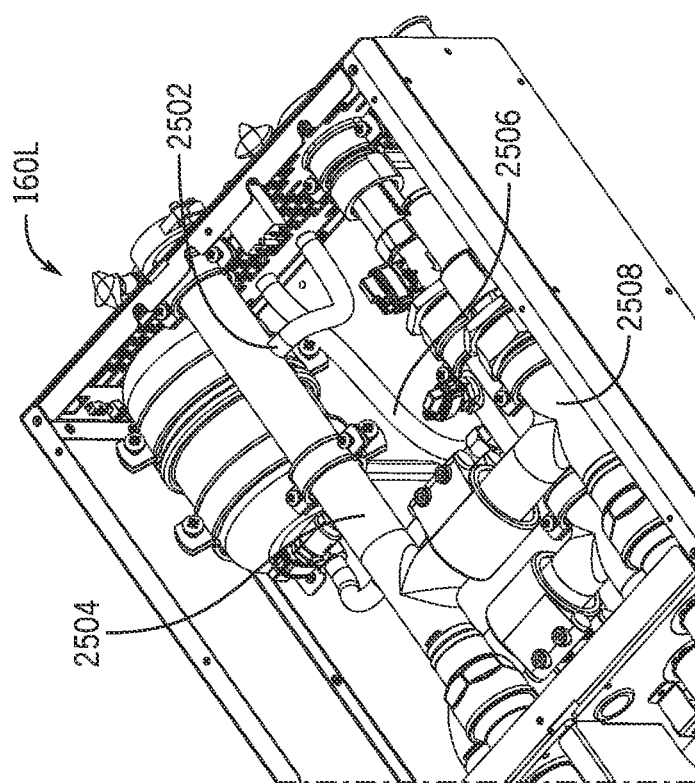

An RPU of a cooling system (e.g., an example of RPU 160 of cooling system 100 shown in FIGS. 1 and 2) can include different arrangements for fill/drain lines and corresponding ports than described, for example, with respect to FIGS. 2, 3, 12A, and 12B. For example, ports for liquid fill and drain lines can be positioned at a rear of an RPU, as can allow servicing of the RPU from a hot aisle or rear of a cabinet in which the RPU is mounted. Additionally, an RPU can include a fill/drain line and corresponding port along an inlet (e.g., at a suction side) and a separate fill/drain line and corresponding port along an outlet (e.g., at a supply side). For example, FIGS. 25 and 26 illustrate an RPU 160L with fill/drain lines positioned at piping of an inlet and outlet of the RPU 160L. For example, as shown in FIG. 25, a first liquid fill/drain line 2506 can be fluidly connected to piping 2508, which can be piping along an inlet (e.g., a return, or suction side) of the RPU 160L, and can further include a fill/drain line 2502 which can be fluidly connected to piping 2504, which can be piping of an outlet (e.g., a supply). A first fill/drain port 2604 can be provided on a rear of the RPU 160L and can be fluidly connected to the fill/drain line 2506 illustrated in FIG. 25. Correspondingly, a second port 2602 can extend from a rear of the RPU 160L and can be fluidly connected to the fill/drain line 2502. The ports 2602, 2604 can be quick connect fittings, which can allow fluid flow when a corresponding hosing of a fill/drain kit or a drain line is connected thereto.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

In some implementations, devices or systems disclosed herein can be utilized, manufactured, installed, etc. using methods embodying aspects of the invention. Correspondingly, any description herein of particular features, capabilities, or intended purposes of a device or system is generally intended to include disclosure of a method of using such devices for the intended purposes, of a method of otherwise implementing such capabilities, of a method of manufacturing relevant components of such a device or system (or the device or system as a whole), and of a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

In some embodiments, aspects of the invention, including computerized implementations of methods according to the invention, can be implemented as a system, method, apparatus, or article of manufacture using standard programming or engineering techniques to produce software, firmware, hardware, or any combination thereof to control a processor device (e.g., a serial or parallel general purpose or specialized processor chip, a single- or multi-core chip, a microprocessor, a field programmable gate array, any variety of combinations of a control unit, arithmetic logic unit, and processor register, and so on), a computer (e.g., a processor device operatively coupled to a memory), or another electronically operated controller to implement aspects detailed herein. Accordingly, for example, embodiments of the invention can be implemented as a set of instructions, tangibly embodied on a non-transitory computer-readable media, such that a processor device can implement the instructions based upon reading the instructions from the computer-readable media. Some embodiments of the invention can include (or utilize) a control device such as an automation device, a special purpose or general purpose computer including various computer hardware, software, firmware, and so on, consistent with the discussion below. As specific examples, a control device can include a processor, a microcontroller, a field-programmable gate array, a programmable logic controller, logic gates etc., and other typical components that are known in the art for implementation of appropriate functionality (e.g., memory, communication systems, power sources, user interfaces and other inputs, etc.). In some embodiments, a control device can include a centralized hub controller that receives, processes and (re)transmits control signals and other data to and from other distributed control devices (e.g., an engine controller, an implement controller, a drive controller, etc.), including as part of a hub-and-spoke architecture or otherwise.

The term "article of manufacture" as used herein is intended to encompass a computer program accessible from any computer-readable device, carrier (e.g., non-transitory signals), or media (e.g., non-transitory media). For example, computer-readable media can include but are not limited to magnetic storage devices (e.g., hard disk, floppy disk, magnetic strips, and so on), optical disks (e.g., compact disk (CD), digital versatile disk (DVD), and so on), smart cards, and flash memory devices (e.g., card, stick, and so on). Additionally it should be appreciated that a carrier wave can be employed to carry computer-readable electronic data such as those used in transmitting and receiving electronic mail or in accessing a network such as the Internet or a local area network (LAN). Those skilled in the art will recognize that many modifications may be made to these configurations without departing from the scope or spirit of the claimed subject matter.

Certain operations of methods according to the invention, or of systems executing those methods, may be represented schematically in the FIGS. or otherwise discussed herein. Unless otherwise specified or limited, representation in the FIGS. of particular operations in particular spatial order may not necessarily require those operations to be executed in a particular sequence corresponding to the particular spatial order. Correspondingly, certain operations represented in the FIGS., or otherwise disclosed herein, can be executed in different orders than are expressly illustrated or described, as appropriate for particular embodiments of the invention. Further, in some embodiments, certain operations can be executed in parallel, including by dedicated parallel processing devices, or separate computing devices configured to interoperate as part of a large system.

As used herein in the context of computer implementation, unless otherwise specified or limited, the terms "component," "system," "module," "block," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

Also as used herein, unless otherwise limited or defined, the terms "about," "substantially," and "approximately" refer to a range of values±5% of the numeric value that the term precedes. As a default the terms "about" and "approximately" are inclusive to the endpoints of the relevant range, but disclosure of ranges exclusive to the endpoints is also intended.

Also as used herein, unless otherwise limited or defined, "integral" and derivatives thereof (e.g., "integrally") describe elements that are manufacture as a single piece without fasteners, adhesive, or the like to secure separate components together. For example, an element stamped as a single-piece component from a single piece of sheet metal, without rivets, screws, or adhesive to hold separately formed pieces together is an integral (and integrally formed) element. In contrast, an element formed from multiple pieces that are separately formed initially then later connected together, is not an integral (or integrally formed) element.

The invention claimed is:

1. A replaceable pump unit (RPU) for liquid cooling of electronic equipment, the RPU comprising:
    a first inlet connection module;
    a first outlet connection module;
    a base plate, the base plate including at least one cassette support feature; and
    a locking structure;
    a first removeable pump cassette, the first removable pump cassette including:
        a cassette frame defining a sled along a bottom of the cassette frame;
        a rotatable protrusion at a front face of the pump cassette,
        a locking mechanism, the locking mechanism being rotatably coupled to the rotatable protrusion;
        a pump including a pump inlet connection module and a pump outlet connection module; and
    a first removable controller and a second removable controller;
    wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module; and
    wherein the first inlet connection module, the first outlet connection module, and the locking structure extend through and are supported by an upstanding plate bracket.

2. The RPU of claim 1, wherein the rotatable protrusion comprises a knob.

3. The RPU of claim 1, wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

4. The RPU of claim 3, wherein the first removable pump cassette includes a motor configured to drive a rotation of the shaft.

5. The RPU of claim 1, wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

6. The RPU of claim 1, further including a liquid fill line, and a liquid fill port, the liquid fill port extending outwardly from a surface of the RPU, and the fill line being in fluid communication with the liquid fill port and piping of the RPU.

7. The RPU of claim 1, wherein the first removable pump cassette includes a fan mounted at a front surface of the first removable pump cassette.

8. The RPU of claim 1, wherein the first removeable controller includes a handle.

9. The RPU of claim 1, wherein a front surface of the first removable pump cassette includes two handles.

10. The RPU of claim 1, wherein the first removable controller is a primary controller and the second removable controller is a backup controller.

11. The RPU of claim 1, wherein at least one of the first removable controller and the second removable controller is in electronic communication with the pump, to control a speed of the pump.

12. The RPU of claim 1, wherein the RPU is mounted within an enclosure comprising at least one fan, and wherein at least one of the first and second removable controllers is in electronic communication with the fan to control a speed thereof.

13. A replaceable pump unit (RPU) for liquid cooling of electronic equipment, the RPU comprising:
- a first inlet connection module;
- a first outlet connection module;
- a base plate, the base plate including at least one cassette support feature; and
- a locking structure;
- a first removeable pump cassette, the first removable pump cassette including:
  - a cassette frame defining a sled along a bottom of the cassette frame;
  - a rotatable protrusion at a front face of the pump cassette,
  - a locking mechanism, the locking mechanism being rotatably coupled to the rotatable protrusion;
  - a pump including a pump inlet connection module and a pump outlet connection module; and
- a first removable controller and a second removable controller;
- wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module; and
- wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

14. The RPU of claim 13, wherein the first inlet connection module, the first outlet connection module, and the locking structure extend through and are supported by an upstanding plate bracket.

15. The RPU of claim 13, wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

16. The RPU of claim 13, further including a liquid fill line, and a liquid fill port, the liquid fill port extending outwardly from a surface of the RPU, and the fill line being in fluid communication with the liquid fill port and piping of the RPU.

17. The RPU of claim 13, wherein the first removable pump cassette includes a fan mounted at a front surface of the first removable pump cassette.

18. The RPU of claim 13, wherein at least one of the first removable controller and the second removable controller is in electronic communication with the pump, to control a speed of the pump.

19. The RPU of claim 13, wherein the RPU is mounted within an enclosure comprising at least one fan, and wherein at least one of the first and second removable controllers is in electronic communication with the fan to control a sped thereof.

20. A replaceable pump unit (RPU) for liquid cooling of electronic equipment, the RPU comprising:
- a first inlet connection module;
- a first outlet connection module;
- a base plate, the base plate including at least one cassette support feature; and
- a locking structure;
- a first removeable pump cassette, the first removable pump cassette including:
  - a cassette frame defining a sled along a bottom of the cassette frame;
  - a rotatable protrusion at a front face of the pump cassette,
  - a locking mechanism, the locking mechanism being rotatably coupled to the rotatable protrusion;
  - a pump including a pump inlet connection module and a pump outlet connection module; and
- a first removable controller and a second removable controller;
- wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module; and
- wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

21. The RPU of claim 20, wherein the first inlet connection module, the first outlet connection module, and the locking structure extend through and are supported by an upstanding plate bracket.

22. The RPU of claim 20, wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

23. The RPU of claim 22, wherein the first removable pump cassette includes a motor configured to drive a rotation of the shaft.

24. The RPU of claim 20, further including a liquid fill line, and a liquid fill port, the liquid fill port extending outwardly from a surface of the RPU, and the fill line being in fluid communication with the liquid fill port and piping of the RPU.

25. The RPU of claim 20, wherein the first removable pump cassette includes a fan mounted at a front surface of the first removable pump cassette.

26. The RPU of claim 20, wherein at least one of the first removable controller and the second removable controller is in electronic communication with the pump, to control a speed of the pump.

27. The RPU of claim 20, wherein the RPU is mounted within an enclosure comprising at least one fan, and wherein at least one of the first and second removable controllers is in electronic communication with the fan to control a sped thereof.

28. A replaceable pump unit (RPU) for liquid cooling of electronic equipment, the RPU comprising:
   a first inlet connection module;
   a first outlet connection module;
   a liquid fill line;
   a liquid fill port, the liquid fill port extending outwardly from a surface of the RPU and being in fluid communication with the liquid fill port and piping of the RPU;
   a base plate, the base plate including at least one cassette support feature; and
   a locking structure;
   a first removeable pump cassette, the first removable pump cassette including:
      a cassette frame defining a sled along a bottom of the cassette frame;
      a rotatable protrusion at a front face of the pump cassette,
      a locking mechanism, the locking mechanism being rotatably coupled to the rotatable protrusion;
      a pump including a pump inlet connection module and a pump outlet connection module; and
   a first removable controller and a second removable controller;
   wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module.

29. The RPU of claim 28, wherein the first inlet connection module, the first outlet connection module, and the locking structure extend through and are supported by an upstanding plate bracket.

30. The RPU of claim 28, wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

31. The RPU of claim 30, wherein the first removable pump cassette includes a motor configured to drive a rotation of the shaft.

32. The RPU of claim 28, wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

33. The RPU of claim 28, wherein the first removable pump cassette includes a fan mounted at a front surface of the first removable pump cassette.

34. The RPU of claim 28, wherein at least one of the first removable controller and the second removable controller is in electronic communication with the pump, to control a speed of the pump.

35. The RPU of claim 28, wherein the RPU is mounted within an enclosure comprising at least one fan, and wherein at least one of the first and second removable controllers is in electronic communication with the fan to control a sped thereof.

36. A replaceable pump unit (RPU) for liquid cooling of electronic equipment, the RPU comprising:
   a first inlet connection module;
   a first outlet connection module;
   a base plate, the base plate including at least one cassette support feature; and
   a locking structure;
   a first removeable pump cassette, the first removable pump cassette including:
      a cassette frame defining a sled along a bottom of the cassette frame;
      a rotatable protrusion at a front face of the pump cassette,
      a locking mechanism, the locking mechanism being rotatably coupled to the rotatable protrusion;
      a pump including a pump inlet connection module and a pump outlet connection module; and
   a first removable controller and a second removable controller;
   wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module; and
   wherein the first removable pump cassette includes a fan mounted at a front surface of the first removable pump cassette.

37. The RPU of claim 36, wherein the first inlet connection module, the first outlet connection module, and the locking structure extend through and are supported by an upstanding plate bracket.

38. The RPU of claim 36, wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

39. The RPU of claim 38, wherein the first removable pump cassette includes a motor configured to drive a rotation of the shaft.

40. The RPU of claim 36, wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

41. The RPU of claim 36, further including a liquid fill line, and a liquid fill port, the liquid fill port extending outwardly from a surface of the RPU, and the fill line being in fluid communication with the liquid fill port and piping of the RPU.

42. The RPU of claim 36, wherein at least one of the first removable controller and the second removable controller is in electronic communication with the pump, to control a speed of the pump.

43. The RPU of claim 36, wherein the RPU is mounted within an enclosure comprising at least one fan, and wherein at least one of the first and second removable controllers is in electronic communication with the fan to control a sped thereof.

44. A replaceable pump unit (RPU) for liquid cooling of electronic equipment, the RPU comprising:
 a first inlet connection module;
 a first outlet connection module;
 a base plate, the base plate including at least one cassette support feature; and
 a locking structure;
 a first removeable pump cassette, the first removable pump cassette including:
  a cassette frame defining a sled along a bottom of the cassette frame;
  a rotatable protrusion at a front face of the pump cassette,
  a locking mechanism, the locking mechanism being rotatably coupled to the rotatable protrusion;
 a pump including a pump inlet connection module and a pump outlet connection module; and
 a first removable controller and a second removable controller;
 wherein, in a locked configuration, an engagement of the locking structure with the locking mechanism locks the first removable pump cassette within the RPU, with the first inlet connection module in fluid communication with the pump inlet connection module, and the first outlet connection module in fluid communication with the pump outlet connection module; and
 wherein the RPU is mounted within an enclosure comprising at least one fan, and wherein at least one of the first and second removable controllers is in electronic communication with the fan to control a speed thereof.

45. The RPU of claim 44, wherein the first inlet connection module, the first outlet connection module, and the locking structure extend through and are supported by an upstanding plate bracket.

46. The RPU of claim 44, wherein the locking mechanism comprises a shaft rotatably coupled to the rotatable protrusion, the shaft including a threaded portion at a distal end of the shaft, and wherein the locking structure includes a threaded bore sized and configured to receive the threaded portion of the shaft.

47. The RPU of claim 46, wherein the first removable pump cassette includes a motor configured to drive a rotation of the shaft.

48. The RPU of claim 44, wherein the at least one cassette support feature includes two opposing brackets mounted to the base plate, each of the at least two opposing brackets including a horizontal surface and a lateral surface, wherein, in the locked configuration, a horizontal surface of the sled engages the horizontal surface of both of the opposing brackets, and the sled is positioned between the lateral surfaces of both of the opposing brackets.

49. The RPU of claim 44, further including a liquid fill line, and a liquid fill port, the liquid fill port extending outwardly from a surface of the RPU, and the fill line being in fluid communication with the liquid fill port and piping of the RPU.

50. The RPU of claim 44, wherein the first removable pump cassette includes a fan mounted at a front surface of the first removable pump cassette.

51. The RPU of claim 44, wherein at least one of the first removable controller and the second removable controller is in electronic communication with the pump, to control a speed of the pump.

* * * * *